United States Patent
Lau et al.

(10) Patent No.: US 12,188,148 B2
(45) Date of Patent: Jan. 7, 2025

(54) MULTI-LAYER EPI CHAMBER BODY

(71) Applicant: Applied Materials, Inc., Santa Clara, CA (US)

(72) Inventors: Shu-Kwan Lau, Sunnyvale, CA (US); Zhiyuan Ye, San Jose, CA (US); Richard O. Collins, Santa Clara, CA (US); Brian Hayes Burrows, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 500 days.

(21) Appl. No.: 17/131,290

(22) Filed: Dec. 22, 2020

(65) Prior Publication Data

US 2022/0195617 A1 Jun. 23, 2022

(51) Int. Cl.
*H01L 21/67* (2006.01)
*C30B 25/08* (2006.01)
*C30B 25/14* (2006.01)

(52) U.S. Cl.
CPC .............. *C30B 25/08* (2013.01); *C30B 25/14* (2013.01); *H01L 21/67* (2013.01)

(58) Field of Classification Search
CPC ................... C30B 25/08; C30B 25/14; H01L 21/67109; H01L 21/67115; H01L 21/67126; H01L 21/67248; H01L 21/68742
See application file for complete search history.

(56) References Cited

U.S. PATENT DOCUMENTS

| | | | |
|---|---|---|---|
| 5,690,795 A * | 11/1997 | Rosenstein | C23C 14/564 118/721 |
| 9,322,097 B2 | 4/2016 | Aboagye et al. | |
| 9,553,002 B2 | 1/2017 | Samir et al. | |
| 9,695,508 B2 | 7/2017 | Carlson et al. | |
| 2003/0153177 A1 | 8/2003 | Tepman et al. | |
| 2005/0133159 A1 | 6/2005 | Johnsgard et al. | |
| 2007/0087533 A1* | 4/2007 | Nishikawa | C23C 16/4409 438/478 |
| 2013/0023129 A1 | 1/2013 | Reed | |

(Continued)

FOREIGN PATENT DOCUMENTS

WO 2018-151882 A1 8/2018

OTHER PUBLICATIONS

International Search Report and Written Opinion dated Mar. 24, 2022 for Application No. PCT/US2021/061254.
Office Action for Korean Application No. 10-2023-7002449 dated Apr. 24, 2024.

*Primary Examiner* — Matthew J Song
(74) *Attorney, Agent, or Firm* — Patterson + Sheridan, LLP

(57) ABSTRACT

An apparatus as disclosed herein relates to a chamber body design for use within a thermal deposition chamber, such as an epitaxial deposition chamber. The chamber body is a segmented chamber body design and includes an inject ring and a base plate. The base plate includes a substrate transfer passage and one or more exhaust passages disposed therethrough. The inject ring includes a plurality of gas inject passages disposed therethrough. The inject ring is disposed on top of the base plate and attached to the base plate. The one or more exhaust passages and the gas inject passages are disposed opposite one another. One or more seal grooves are formed in both the base plate and the inject ring to enable the inject ring and the base plate to seal to one another as well as other components within the process chamber.

20 Claims, 14 Drawing Sheets

(56) References Cited

U.S. PATENT DOCUMENTS

| | | | |
|---|---|---|---|
| 2014/0076234 A1* | 3/2014 | Kao | H01J 37/32082 |
| | | | 118/719 |
| 2014/0261159 A1 | 9/2014 | Okabe et al. | |
| 2014/0322897 A1 | 10/2014 | Samir et al. | |
| 2015/0147053 A1* | 5/2015 | Ranish | H05B 3/0047 |
| | | | 392/411 |
| 2016/0230276 A1* | 8/2016 | Aboagye | C23C 16/4584 |
| 2017/0004966 A1* | 1/2017 | Sato | H01J 37/32183 |
| 2018/0033652 A1* | 2/2018 | Samir | C23C 16/455 |

\* cited by examiner

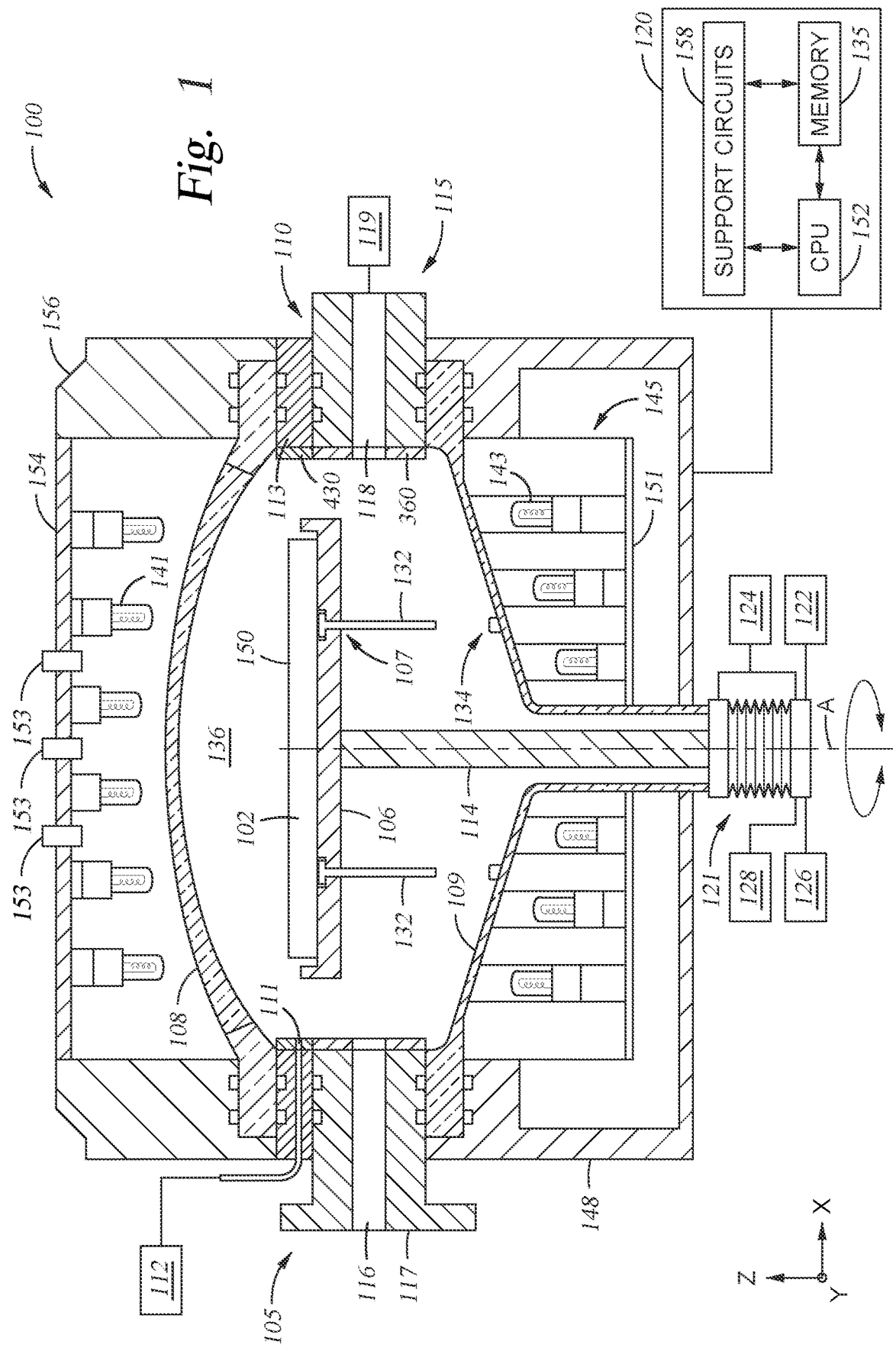

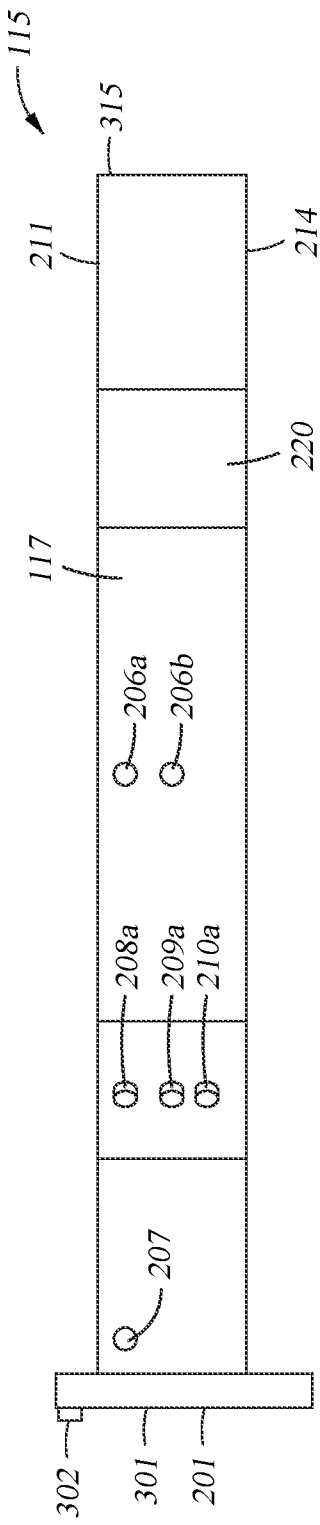
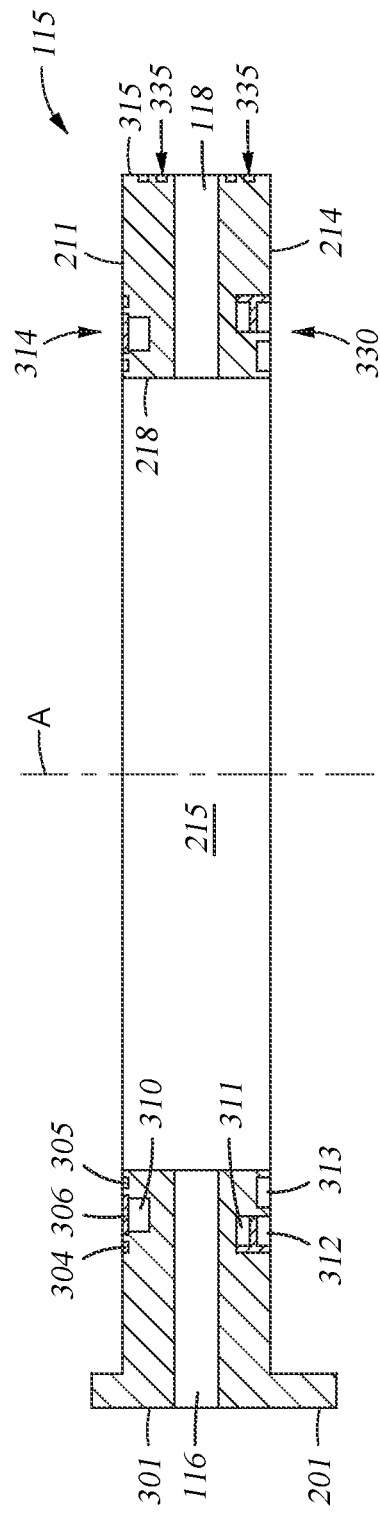
Fig. 3A
Fig. 3C

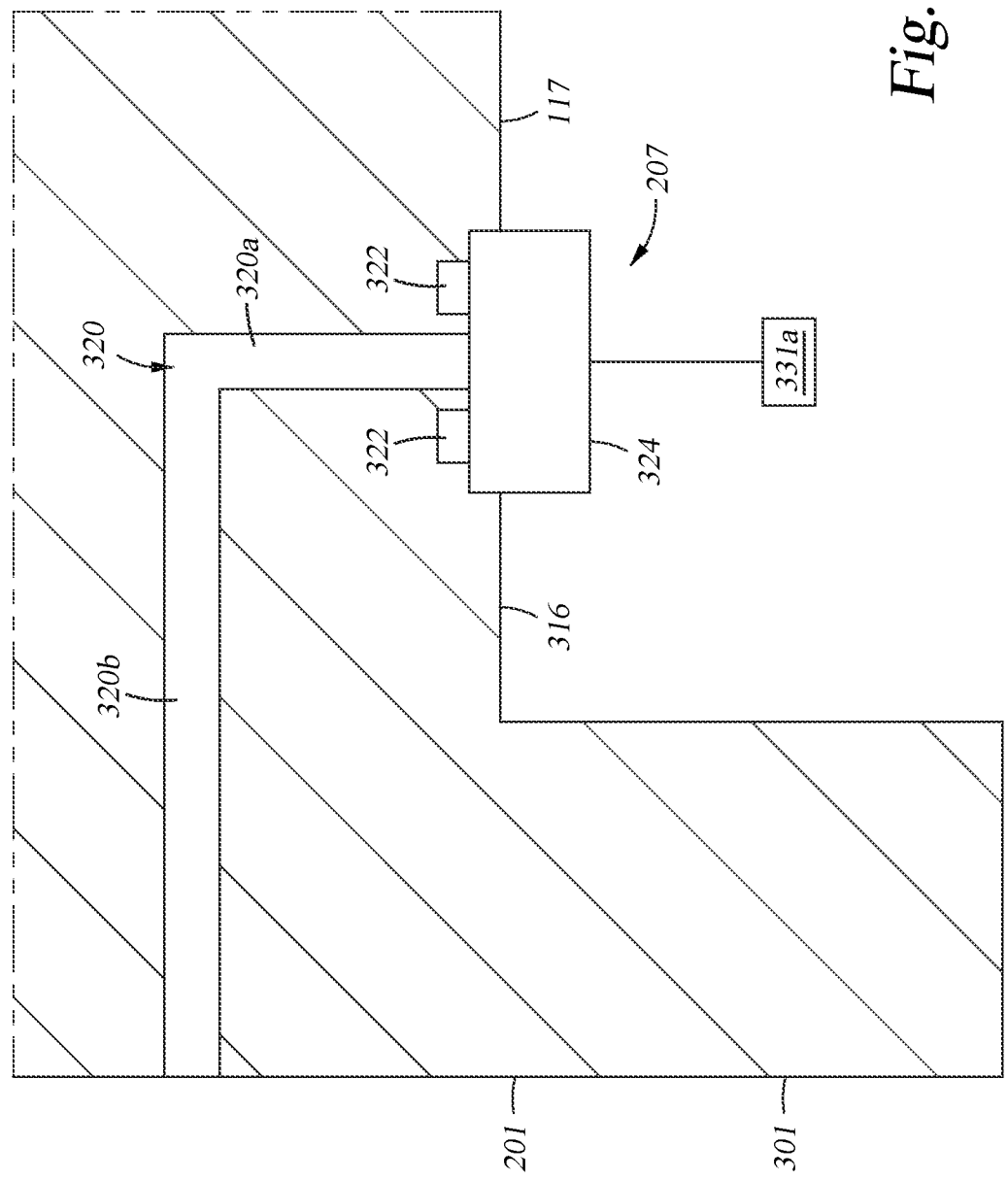

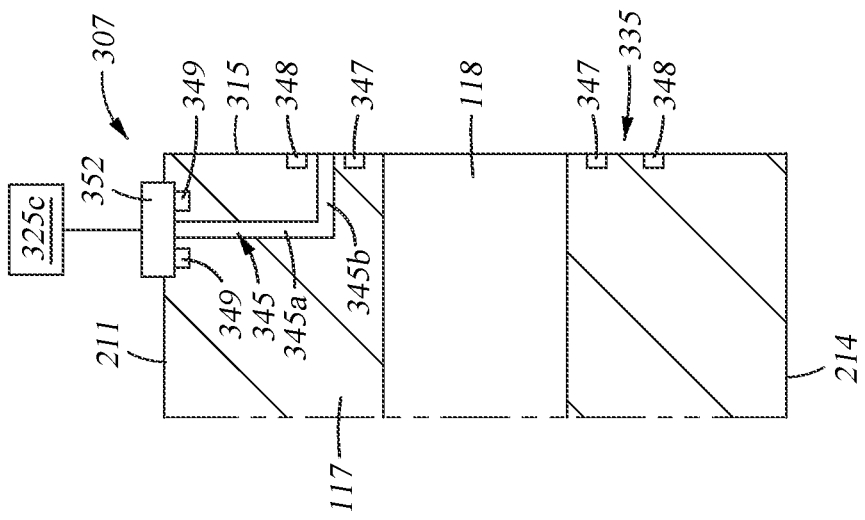
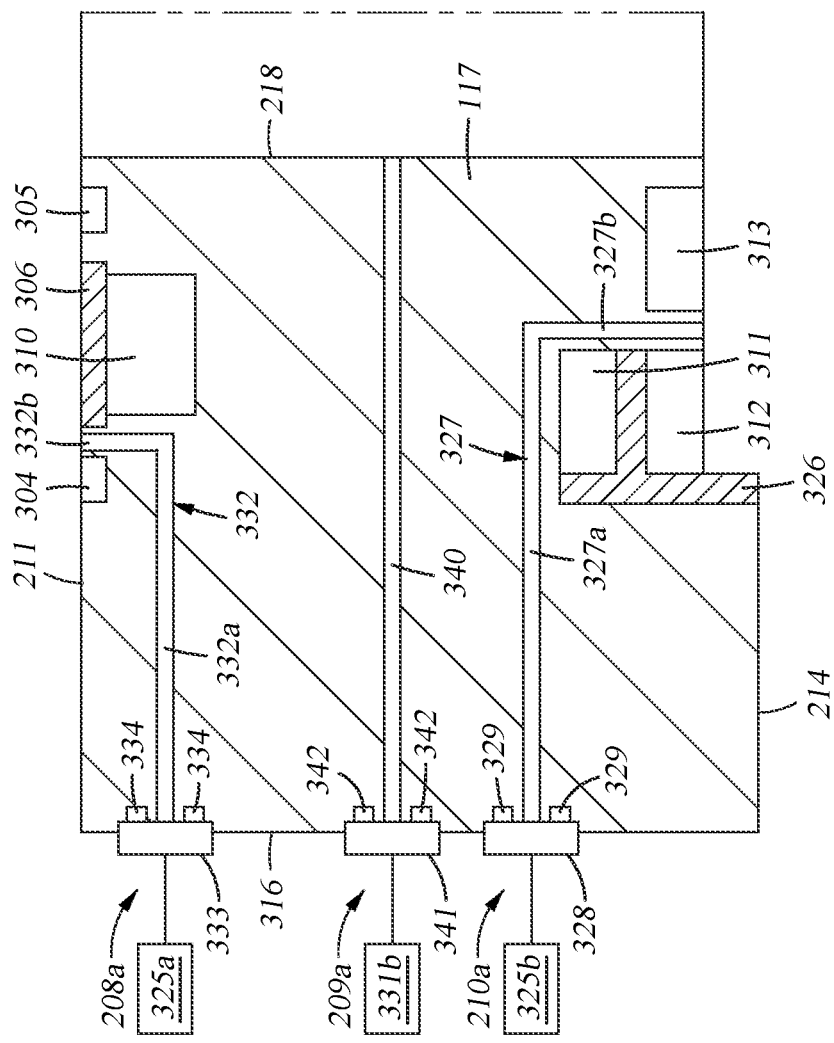
Fig. 3E
Fig. 3F

MULTI-LAYER EPI CHAMBER BODY

BACKGROUND

Field

Embodiments of the present disclosure generally relate to apparatus and methods for fabricating semiconductor devices. More specifically, apparatus disclosed herein relate to a chamber body and related components for use in semiconductor processing apparatus.

Description of the Related Art

Semiconductor substrates are processed for a wide variety of applications, including the fabrication of integrated devices and microdevices. During processing, the substrate is positioned on a susceptor within a process chamber. The susceptor is supported by a support shaft, which is rotatable about a central axis. Precise control over a heating source, such as a plurality of heating lamps disposed below and above the substrate, allows the substrate to be heated within very strict tolerances. The temperature of the substrate can affect the uniformity of the material deposited on the substrate.

The design of the process chamber body has a significant impact on temperature distribution, precursor flow path, and throughput within the process chamber. Improvements to the design of the chamber body are continuously being made. Improvements include changes to the precursor flow path, the exhaust flow path, the orientation of openings through the chamber body with respect to one another, and the inner shape of the chamber body. Previous chamber bodies have been singular chamber bodies. Previous chamber bodies have high replacement costs and therefore prevent rapid innovation and change within the chamber body design.

Therefore, a need exists for improved chamber body and related components which enable low cost replacement of hardware components.

SUMMARY

The present disclosure is generally related to a chamber body assembly for substrate processing. In one embodiment, the chamber body assembly includes a base plate and an inject ring. The base plate includes a first upper surface, a first lower surface, a first inner surface forming an annular opening, and a first outer surface disposed radially outward from the first inner surface. A substrate transfer passage is formed between the first inner surface and the first outer surface along a first side, and one or more exhaust passages are formed between the inner surface and the outer surface opposite the substrate transfer passage along a second side. The inject ring includes a second upper surface, a second lower surface contacting the first upper surface, a second inner surface disposed from the second upper surface to the second lower surface and forming the annular opening, such that the first inner surface and the second inner surface have a same inner radius, and a second outer surface disposed from the second upper surface to the second lower surface and disposed radially outward from the second inner surface. A plurality of gas inject passages are formed through the second inner surface along the first side.

In another embodiment, a base plate for substrate processing includes a base body. The base body includes an upper surface, a lower surface, an inner surface disposed from the upper surface to the lower surface and forming an annular opening, and an outer surface disposed from the upper surface to the lower surface and radially outward from the inner surface. A substrate transfer passage is formed between the inner surface and the outer surface along a first side. One or more exhaust passages are formed between the inner surface and the outer surface opposite the substrate transfer passage along a second side. One or more intermediate coupling seal grooves are disposed along the upper surface and surrounding the inner surface. One or more lower coupling seal grooves are disposed along the lower surface and surrounding the inner surface. One or more purge gas passages are disposed between the inner surface and the outer surface.

In yet another embodiment, an inject ring for substrate processing is described. The inject ring includes a ring body. The ring body includes an upper surface, a lower surface, an inner surface disposed from the upper surface to the lower surface and forming an annular opening, and an outer surface disposed from the upper surface to the lower surface and radially outward from the inner surface. A plurality of gas inject passages are formed between the inner surface and the outer surface along a first side. One or more upper coupling seal grooves are disposed along the upper surface and surrounding the inner surface. One or more purge gas passages are disposed between the inner surface and the outer surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 1 is a schematic illustration of a deposition chamber according to embodiments of the present disclosure.

FIG. 3A is a schematic side view illustration of a base plate of FIGS. 2A-2B according to embodiments of the present disclosure.

FIG. 3C is a schematic cross sectional side view illustration of the base plate of FIG. 3B through plane 3C-3C according to embodiments of the present disclosure.

FIG. 3D is a schematic cross sectional view illustration of the base plate of FIG. 3B through the plane 3D-3D according to embodiments of the present disclosure.

FIG. 3E is a schematic cross sectional view illustration of the base plate of FIG. 3B through the plane 3E-3E according to embodiments of the present disclosure.

FIG. 3F is a schematic cross sectional view illustration of the base plate of FIG. 3B through the plane 3F-3F according to embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2A:
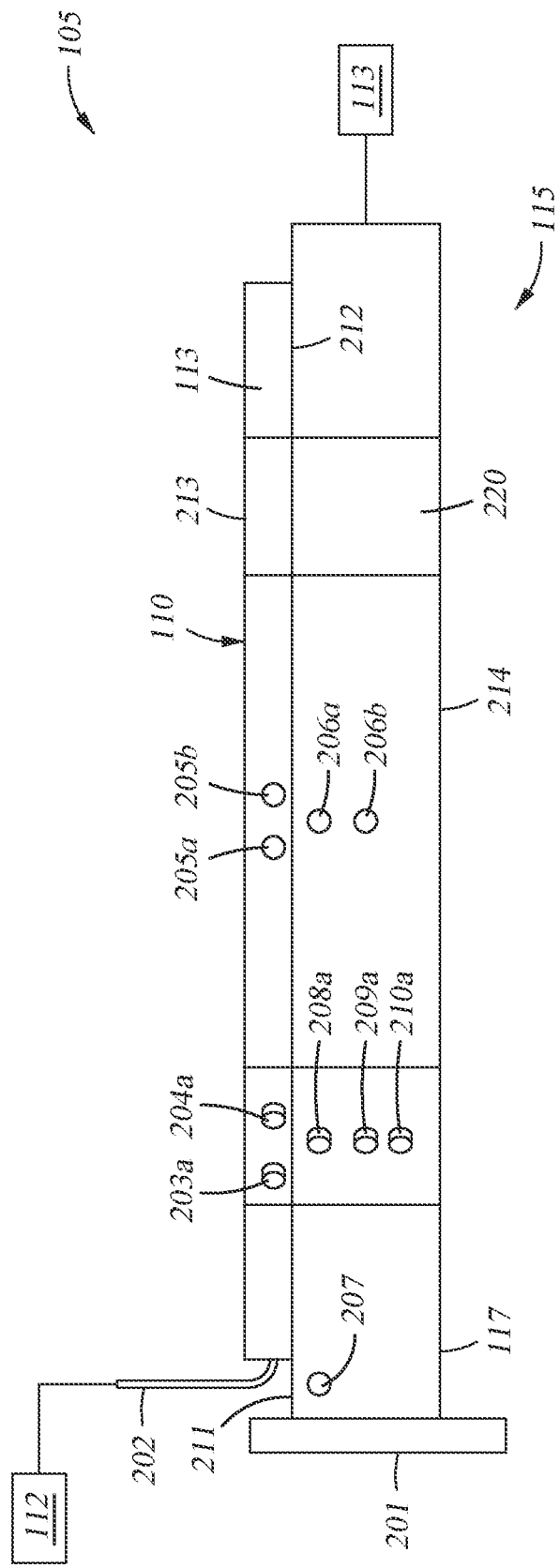
FIG. 2A is a schematic side view illustration of a chamber body assembly according to embodiments of the present disclosure.

The present disclosure generally relates to apparatus for semiconductor processing. More specifically, apparatus disclosed herein relate to a chamber body design for use within a thermal deposition chamber, such as an epitaxial deposition chamber. The chamber body is a segmented chamber body design, which enables reduced cost of replacement of portions of the chamber body after the portion of the chamber body is worn or when an improved design to a portion of the chamber body is available. The disclosed segmented chamber body overcomes conventional challenges, including alteration of the process gas flow through the chamber volume, inconsistencies in thermal distribution, sealing between the chamber body segments, and integration of each of the chamber body segments with pre-existing chamber elements.

Disclosed herein are embodiments of a segmented chamber body. The embodiments disclosed herein include an inject ring and a base plate. Each of the inject ring and the base plate are used together to flow one or more process gases horizontally across the surface of a substrate. The inject ring and the base plate are connected to one another and sealed. Embodiments such as those disclosed herein improve the gas flow path and are cheaper to maintain/replace.

FIG. 1 is a schematic illustration of a deposition chamber 100 according to embodiments of the present disclosure. The deposition chamber 100 is an epitaxial deposition chamber and may be used within a cluster tool (not shown). The deposition chamber 100 is utilized to grow an epitaxial film on a substrate, such as the substrate 102. The deposition chamber 100 creates a cross-flow of precursors across the top surface 150 of the substrate 102.

The deposition chamber 100 includes an upper body 156, a lower body 148 disposed below the upper body 156, a chamber body assembly 105 is disposed between the upper body 156 and the lower body 148. The upper body 156, the chamber body assembly 105, and the lower body 148 form a chamber apparatus. Disposed within the chamber apparatus is a substrate support 106, an upper window 108, a lower window 109, a plurality of upper lamps 141, and a plurality of lower lamps 143. As shown, the controller 120 is in communication with the deposition chamber 100 and is used to control processes, such as those described herein. The controller 120 includes a central processing unit (CPU) 152, a memory device 135, and support circuits 158. Each of the CPU 152, memory device 135, and the support circuits 158 are similar to those typically found in substrate processing assemblies. The substrate support 106 is disposed between the upper window (e.g., dome) 108 and the lower window (e.g., dome) 109. The plurality of upper lamps 141 are disposed between the upper window 108 and a lid 154. The lid 154 includes a plurality of sensors 153 disposed therein for measuring the temperature within the deposition chamber 100. The plurality of lower lamps 143 are disposed between the lower window 109 and a floor 151. The plurality of lower lamps 143 form a lower lamp assembly 145.

A processing volume 136 is formed between the upper window 108 and the lower window 109. The processing volume 136 has the substrate support 106 disposed therein. The substrate support 106 includes a top surface on which the substrate 102 is disposed. The substrate support 106 is attached to a shaft 114. The shaft 114 is connected to a motion assembly 121. The motion assembly 121 includes one or more actuators and/or adjustment devices that provide movement and/or adjustment of the shaft 114 and/or the substrate support 106 within the processing volume 136. The motion assembly 121 includes a rotary actuator 122 that rotates the shaft 114 and/or the substrate support 106 about a longitudinal axis A (e.g., a central vertical axis) of the deposition chamber 200. The motion assembly 121 further includes a vertical actuator 124 to lift and lower the substrate support 106 in the z-direction. The motion assembly 121 includes a tilt adjustment device 126 that is used to adjust the planar orientation of the substrate support 106 and a lateral adjustment device 128 that is used to adjust the position of the shaft 114 and the substrate support 106 side to side within the processing volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a processing position to a transfer position.

The chamber body assembly 105 as shown herein is a segmented chamber body assembly. The chamber body assembly 105 includes a base plate 115 and an inject ring 110. The base plate 115 includes a base body 117, a substrate transfer passage 116, and one or more exhaust passages 118 disposed therethrough. The substrate transfer passage 116 is sized to enable a substrate and a robot arm to pass therethrough. In some embodiments, the substrate transfer passage 116 is greater than 200 mm in width, such as greater than 300 mm in width. The one or more exhaust passages 118 are fluidly coupled to the processing volume 136 and an exhaust pump 119. The inject ring 110 is disposed on top of and coupled to the base plate 115. The inject ring 110 includes an inject body 113 and a plurality of gas inject passages 111. The plurality of gas inject passages 111 are disposed vertically above the substrate transfer passage 116 and across from the one or more exhaust passages 118. The gas inject passages 111 are fluidly connected to a process gas source 112. The plurality of gas inject passages 111 are vertically offset from the one or more exhaust passages 118 as the plurality of gas inject passages 111 are formed through the inject ring 110, which is disposed on top of the base plate 115. Therefore, the plurality of gas inject passages 111 are disposed vertically above the one or more exhaust passages 118.

One or both of the base plate 115 and the inject ring 110 may further include a plurality of purge gas inlets (not shown). The plurality of purge gas inlets may be disposed below the plurality of gas inject passages 111, such that the plurality of purge gas inlets are disposed between the plurality of gas inject passages 111 and the substrate transfer passage 116. The plurality of purge gas inlets may alternatively be vertically aligned with the plurality of gas inject passages 111, such that the plurality of purge gas inlets may also be represented by the plurality of gas inject passages 111.

One or more liners 360, 430 are disposed on the inner surface of the chamber body assembly 105 and protect the chamber body assembly 105 from reactive gases used during deposition processes. In some embodiments, a single liner is utilized and the one or more liners 360, 430 are combined. The gas inject passages 111 and the purge gas inlets are positioned to flow a gas parallel to the top surface 150 of a substrate 102 disposed within the processing volume 136.

FIG. 2A is a schematic side view illustration of a chamber body assembly 105 according to embodiments of the present disclosure. As discussed with reference to FIG. 1, the chamber body assembly 105 includes the base plate 115 and the inject ring 110. The base plate 115 includes an upper surface 211 and a lower surface 214 of the base body 117. The inject ring 110 includes an upper surface 213 and a lower surface 212 of the inject body 113. The inject ring 110 is stacked on top of the base plate 115, such that the lower surface 212 of the inject ring 110 is in contact with the upper surface 211 of the base plate 115.

When the base plate 115 and the inject ring 110 are described with respect to one another, the upper surface 211 and the lower surface 214 of the base plate 115 may be called a first upper surface and a first lower surface respectively. Similarly, the upper surface 213 and the lower surface 212 of the inject body 113 may be described as a second upper surface and a second lower surface respectively. The naming structure described herein similarly applies to other elements which are similarly described between the base plate 115 and the inject ring 110.

The base plate 115 includes a flange 201 disposed along one side of the base plate 115. The flange 201 is configured to couple the chamber body assembly 105 to a transfer chamber (not shown) of a cluster tool (not shown). The flange 201 extends vertically upward beyond the upper surface 211 of the base plate 115 as well as vertically downward beyond the lower surface 214 of the base plate 115. The base plate 115 further includes a chamber coupling purge connection 207, one or more cooling channel connections 206a, 206b, one or more upper chamber body seal connections 208a, 208b, one or more lower purge gas connections 209a, 209b, and one or more lower window seal connections 210a, 210b disposed therethrough. The one or more cooling channel connections 206a, 206b includes an inlet cooling channel connection 206a and an outlet cooling channel connection 206b disposed adjacent one another. Each of the upper chamber body seal connection 208a, the lower purge gas connection 209a, and the lower window seal connection 210a are aligned along the base body 117, such that the upper chamber body seal connection 208a is disposed above the lower purge gas connection 209a and the purge gas connection 209a is disposed above the lower window seal connection 210a. Each of the upper chamber body seal connection 208b, the lower purge gas connection 209b, and the lower window seal connection 210b are similarly aligned. Each of the upper chamber body seal connection 208b, the lower purge gas connection 209b, and the lower window seal connection 210b are mirrored with each of the upper chamber body seal connection 208a, the lower purge gas connection 209a, and the lower window seal connection 210a. Any passages coupled to the upper chamber body seal connection 208a, the lower purge gas connection 209a, and the lower window seal connection 210a are similarly mirrored on the opposite side of the base plate 115 and coupled to each of the upper chamber body seal connection 208b, the lower purge gas connection 209b, and the lower window seal connection 210b.

The inject ring 110 includes one or more cooling channel connections 205a, 205b, one or more upper window seal connections 203a, 203b, and one or more upper purge gas connections 204a, 204b. A first upper window seal connection 203a and a first upper purge gas connection 204a are shown in FIG. 2A. The one or more cooling channel connections 205a, 205b are disposed on an outer sidewall of the inject body 113. The one or more cooling channel connections 205a, 205b are proximate one another. The upper window seal connections 203a, 203b and the upper purge gas connections 204a, 204b are similarly disposed on an outer sidewall of the inject body 113. The upper window seal connections 203a, 203b and the upper purge gas connections 204a, 204b are aligned along a horizontal plane, such that the first upper window seal connection 203a is vertically horizontally aligned with the first upper purge gas connection 204a and similarly, the second upper window seal connection 203b is vertically horizontally aligned with the second upper purge gas connection 204b. The process gas source 112 is connected to the inject ring 110 via one or more gas line connections 202 disposed along the outer surface of the inject ring 110 and coupled to the plurality of gas inject passages 111.

Figure 2B:
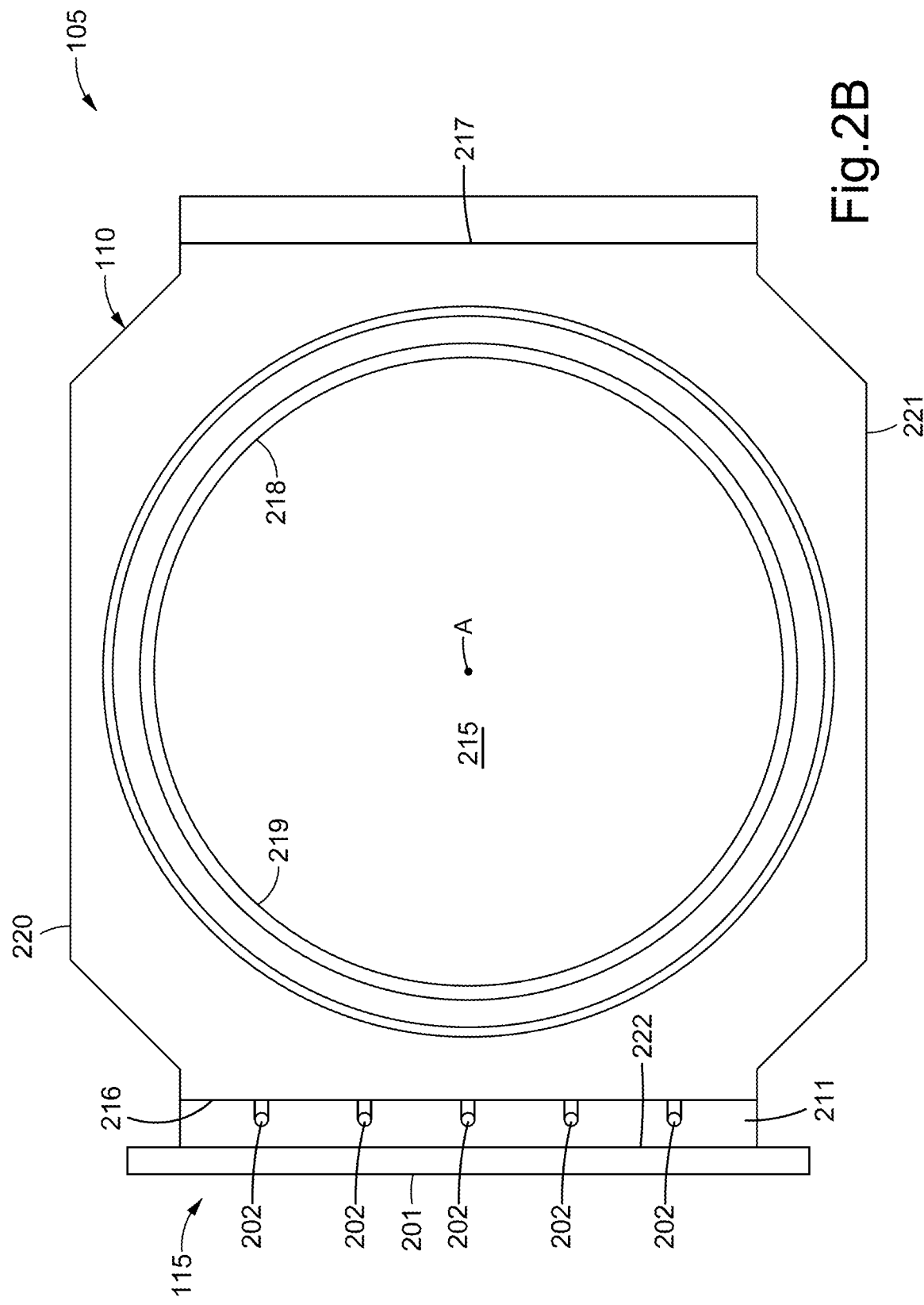
FIG. 2B is a schematic plan view illustration of the chamber body assembly of FIG. 2A according to embodiments of the present disclosure.

As shown in FIG. 2B, both the base plate 115 and the inject ring 110 include inner surfaces 218, 219 and outer surfaces 220, 221. The inner surfaces 218, 219 form an annular opening 215 through the chamber body assembly 105. The annular opening 215 is sized such that a substrate and a substrate support may be disposed therein. The annular opening 215 may at least partially define the processing volume 136 of FIG. 1. The outer surfaces 220, 221 form the outside of each of the base plate 115 and the inject ring 110. The base body 117 of the base plate 115 is disposed between the inner surface 218 and the outer surface 220. The inject body 113 of the inject ring 110 is disposed between the inner surface 219 and the outer surface 221. When disclosed with reference to one another, the outer surface 220 and the inner surface 218 of the base plate 115 may be described as a first outer surface and a first inner surface. Similarly, the outer surface 221 and the inner surface 219 of the inject ring 110 may be described as a second outer surface and a second inner surface.

The inner surfaces 218, 219 of both the base plate 115 and the inject ring 110 may be aligned, such that the inner surfaces 218, 219 of both of the base plate 115 and the inject ring 110 include similar diameters and are centered about a central axis A, such that, in one example, the inner radius of each of the base plate 115 and the inject ring 110 are the same. The inner surfaces 218, 219 may be generally circular, with a diameter of about 200 mm or greater, such as about 250 mm or greater, such as about 250 mm to about 500 mm, such as about 300 mm to about 450 mm. Other dimensions are also contemplated.

The one or more gas line connections 202 (five are shown) are disposed along an outer surface 221 of the inject ring 110. The plurality of gas line connections 202 are spaced along a first side 216 of the inject ring 110. The first side 216 of the inject ring 110 is adjacent the flange 201 of the base plate 115. The one or more gas line connections 202 are disposed between the first side 216 of the inject ring 110 and an inner surface 222 of the flange 201. The inner surface 222 of the flange 201 is the surface facing the annular opening 215. A second side 217 is disposed opposite the first side 216 of the inject ring 110. The second side 217 is disposed above the exhaust passages 118. In some embodiments, the first side 216 is classified as an inject side or an inlet side, while the second side 217 is classified as an outlet side or an exhaust side.

Figure 3B:
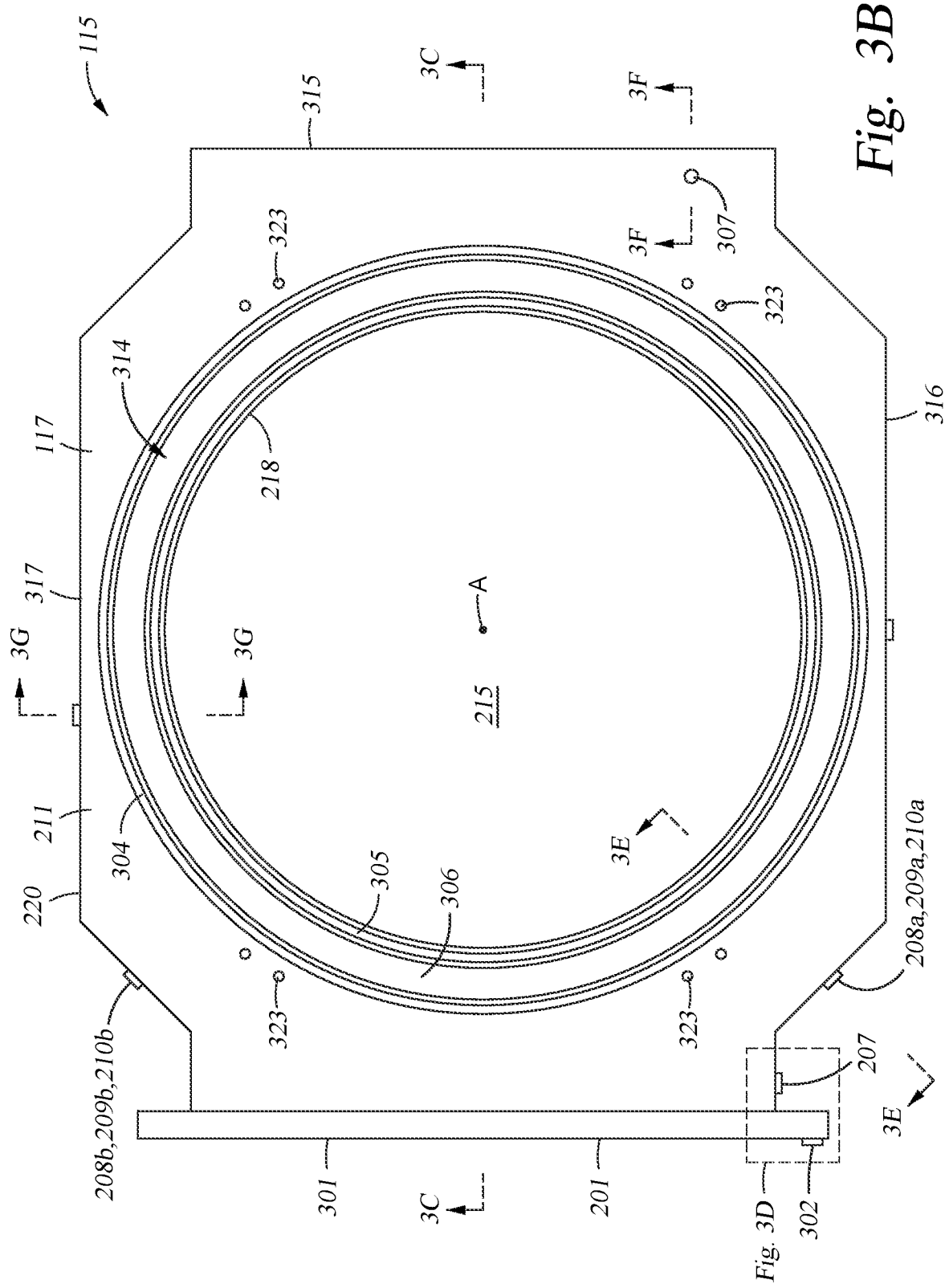
FIG. 3B is a schematic plan view illustration of the base plate of FIG. 3A according to embodiments of the present disclosure.

The base plate 115 shown in FIGS. 3A-3H is a detailed view of the base plate 115 of FIGS. 1 and 2A-2B when separated from the inject ring 110. As shown in FIG. 3A, the base plate 115 includes a first side 301 and a second side 315. The first side 301 is an outer surface of the flange 201, such that the first side 301 is part of the outer surface 220 of the base plate 115. The second side 315 is disposed opposite the first side 301 and includes the exhaust passages 118 disposed therethrough (FIG. 3C). The second side 315 forms another portion of the outer surface 220 of the base plate 115.

The first side 301 includes a connection protrusion 302 protruding from the outer surface of the flange 201. The connection protrusion 302 is a cylindrical protrusion and is configured to align with an opening on a cluster tool (not shown) to assist in securing the base plate 115 to the cluster tool. The connection protrusion 302 may be one of several connection protrusions disposed from the flange 201. In some embodiments, there are a plurality of connection protrusions 302. The connection protrusions 302 may be metal dowels, pegs, fasteners, pins, or catches.

FIG. 3B is a schematic plan view illustration of the base plate 115 of FIG. 3A according to embodiments of the present disclosure. As illustrated in FIG. 3B, the base plate 115 includes a third side 316, a fourth side 317, and one or more intermediate coupling seal (e.g., o-ring) grooves 314 disposed in the upper surface 211 of the base body 117. The third side 316 and the fourth side 317 are disposed between the first side 301 and the second side 315. The third side 316 and the fourth side 317 form portions of the outer surface 220 of the base plate 115 and may be described as outer sidewalls. The third side 316 is disposed opposite the fourth side 317.

The one or more intermediate coupling seal grooves 314 includes a first seal groove 304, a second seal groove 305, and a channel cover 306 disposed between the first seal groove 304 and the second seal groove 305. Each of the first seal groove 304, the second seal groove 305, and the channel cover 306 are disposed around the inner surface 218 of the base plate 115, such that the first seal groove 304, the second seal groove 305, and the channel cover 306 form rings surrounding the inner surface 218. The first seal groove 304, the second seal groove 305, and the channel cover 306 are disposed between the inner surface 218 and the outer surface 220. The first seal groove 304 and the second seal groove 305 are sized to receive an o-ring therein and disposed within the upper surface 211. The first seal groove 304 and the second seal groove 305 are configured to enable a seal to be formed between the base plate 115 and the inject ring 110 when the inject ring 110 is placed on top of the base plate 115.

The base plate 115 further includes a plurality of fastener openings 323 disposed around the inner surface 218 and the one or more intermediate coupling seal grooves 314. The plurality of fastener openings 323 are disposed through the upper surface 211 of the base body 117 and sized to receive a fastener, such as a screw or a bolt. In some embodiments, there are four or more fastener openings 323 disposed about the inner surface 218 of the base plate 115, such as six or more fastener openings 323, such as eight or more fastener openings 323. The plurality of fastener openings 323 are disposed evenly around the inner surface 218 in order to distribute the coupling force between the base plate 115 and the inject ring 110 and enable proper sealing. In some embodiments, the fastener openings 323 are grouped into sets with the sets being evenly distributed around the inner surface 218. The sets may be groups of two or more fastener openings 323, such as two fastener openings or three fastener openings. In embodiments described herein, two or more fastener openings 323 are disposed between the inner surface 218 and the first side 301 of the outer surface 220 while an additional two or more fastener openings 323 are disposed between the inner surface 218 and the second side 315 of the outer surface 220.

An exhaust seal connection 307 is disposed on the upper surface 211 of the base plate 115 and between the inner surface 218 of the base plate 115 and the second side 315 of the outer surface 220. The exhaust seal connection 307 is formed on an exhaust protrusion portion of the base plate 115. The exhaust seal connection 307 is formed between the one or more intermediate coupling seal grooves 314 and the second side 315.

The one or more intermediate coupling seal grooves 314, the one or more lower coupling seal grooves 330, and one or more cooling channels 310, 311 are illustrated in FIG. 3C. The first seal groove 304, the second seal groove 305, and the channel cover 306 are shown extending downward from the upper surface 211 of the base plate 115. The top surfaces of each of the first seal groove 304, the second seal groove 305, and the channel cover 306 are parallel and coplanar to the upper surface 211 of the base plate 115. The coplanar orientation of the tops of the first seal groove 304, the second seal groove 305, and the channel cover 306 enable better sealing between the base plate 115 and the inject ring 110. The first seal groove 304 is disposed radially outward from the second seal groove 305 with respect to the central axis A. Each of the first seal groove 304 and the second seal groove 305 are concentric and disposed about the central axis A.

An upper cooling channel 310 is disposed between the first seal groove 304 and the second seal groove 305. The upper cooling channel 310 is similarly formed around the inner surface 218. The upper cooling channel 310 is fluidly connected to one of the cooling channel connections 206a, 206b, such that fluid flows into the upper cooling channel 310 through an inlet cooling channel connection 206a and out of the upper cooling channel 310 through an outlet cooling channel connection 206b. The upper cooling channel 310 may be formed by forming a coolant groove along the upper surface 211 of the base body 117. The upper cooling channel 310 is covered with a channel cover 306. The channel cover 306 is placed within the cooling groove and forms the upper cooling channel 310, such that the upper cooling channel 310 is isolated from the upper surface 211 of the base plate 115. The upper cooling channel 310 extends inward of the base body 117 from the upper surface 211 and is used to maintain the base plate 115 at a set temperature during use within a substrate processing chamber, such as the deposition chamber 100. The upper cooling channel 310 is disposed between the upper surface 211 and the substrate transfer passage 116 as well as between the upper surface 211 and the one or more exhaust passages 118. The formation of the upper cooling channel 310 adjacent to the upper surface 211 and between the first seal groove 304 and the second seal groove 305 enables the upper cooling channel 310 to cool both the base plate 115 and the inject ring 110, as the upper cooling channel 310 is only separated from the inject ring 110 by the channel cover 306. The separation by only the channel cover 306 enables easy formation of the upper cooling channel 310 and minimal thermal mass between the upper cooling channel 310 and the bottom of the inject ring 110.

One or more lower coupling seal grooves 330 are formed along the lower surface 214 of the base body 117. The one or more lower coupling seal grooves 330 includes a first lower seal groove 312 and a second lower seal groove 313. The first lower seal groove 312 and the second lower seal groove 313 are sized to receive an o-ring therein. The first lower seal groove 312 and the second lower seal groove 313 are concentric, such that the first lower seal groove 312 is disposed radially outward of the second lower seal groove 313 and centered around the central axis A. Each of the first lower seal groove 312 and the second lower seal groove 313 are formed around the inner surface 218 of the base body 117.

A lower cooling channel 311 is disposed within the base body 117 and above the first lower seal groove 312 and the second lower seal groove 313. The lower cooling channel 311 is disposed between the lower surface 214 of the base body 117 and the substrate transfer passage 116 as well as between the lower surface 214 and the one or more exhaust passages 118. The lower cooling channel 311 is fluidly connected to one or more of the cooling channel connections 206a, 206b, such that fluid flows into the lower cooling channel 311 through an inlet cooling channel connection 206a and out of the lower cooling channel 311 through an outlet cooling channel connection 206b. The lower cooling channel 311 may be formed by forming a coolant groove along the lower surface 214 of the base body 117. The coolant groove is covered with a channel formation component 326 to form the lower cooling channel 311 and the first lower seal groove 312 as shown in FIG. 3E.

Each of the upper cooling channel 310 and the lower cooling channel 311 are fluidly connected, such that both the upper cooling channel 310 and the lower cooling channel 311 are fluidly coupled to the cooling channel connections 206a, 206b.

One or more exhaust coupling seal grooves 335 are disposed on the second side 315 of the outer surface 220 of the base body 117. The one or more exhaust coupling seal grooves 335 are formed around the one or more exhaust passages 118. The one or more exhaust coupling seal grooves 335 are configured to receive o-rings and form a seal around the one or more exhaust passages 118 when the second side 315 of the base body 117 is contacting and coupled to an exhaust module (not shown). The one or more exhaust coupling seal grooves 335 may include two or more o-ring grooves, such as two o-ring grooves or three o-ring grooves. Each of the exhaust coupling seal grooves 335 are formed about the entirety of the one or more exhaust passages 118.

FIG. 3D is a schematic cross sectional view illustration of the chamber coupling purge connection 207 of FIG. 3B through the plane 3D-3D according to embodiments of the present disclosure. The chamber coupling purge connection 207 may be a connection or a divot within the base body 117. The chamber coupling purge connection 207 is coupled to a chamber coupling purge passage 320. The chamber coupling purge passage 320 extends inward from the third side 316 of the outer surface 220 of the base body 117 and inward from the first side 301 of the outer surface 220 of the base body 117. The chamber coupling purge passage 320 fluidly connects the third side 316 of the base body 117 with the first side 301 of the base body 117, such that gas injected into an opening of the chamber coupling purge passage 320 on the third side 316 escapes through an opening of the chamber coupling purge passage 320 on the first side 301. In some embodiments, the first side 301 of the base body 117 is referred to as the chamber coupling surface.

The chamber coupling purge passage 320 includes a first chamber connection purge passage segment 320a and a second chamber connection purge passage segment 320b. The first chamber connection purge passage segment 320a extends inward from the third side 316 and connects to the second chamber connection purge passage segment 320b at an end of the first chamber connection purge passage segment 320a distal from the third side 316. The second chamber connection purge passage segment 320b extends from the first side 301 to the first chamber connection purge passage segment 320a. The first chamber connection purge passage segment 320a and the second chamber connection purge passage segment 320b intersect at an angle, such as a perpendicular angle. Each of the first chamber connection purge passage segment 320a and the second chamber connection purge passage segment 320b are linear passages. The opening of the chamber coupling purge passage 320 on the third side 316 is surrounded by a connection seal groove 322. The connection seal groove 322 is sized to receive an o-ring and enables the formation of a seal between the chamber coupling purge passage 320 and the first purge gas cap 324. The first purge gas cap 324 is coupled to a first purge gas source 331a. The first purge gas cap 324 is inserted into a groove along the third side 316 of the base body 117 and surrounds the opening to the first chamber connection purge passage segment 320a. The chamber coupling purge passage 320 enables purging between a transfer chamber (not shown) and the deposition chamber 100 at the connection between the transfer chamber and the deposition chamber 100. The first purge gas cap 324 is disposed to purge gas leaked between the flange 201 and a transfer chamber when the flange 201 is coupled to the transfer chamber.

FIG. 3E illustrates a segment of the base plate 115 of FIG. 3B through the plane 3E-3E. The upper chamber body seal connection 208a, the lower purge gas connection 209a, and the lower window seal connection 210a are shown as being coupled to the third side 316 of the outer surface 220 of the base body 117. The upper chamber body seal connection 208a is coupled to a body seal passage 332. The lower purge gas connection 209a is coupled to a lower purge gas passage 340. The window seal connection 210a is coupled to the lower window seal passage 327. Although not explicitly shown, the upper chamber body seal connection 208b, the lower purge gas connection 209b, and the lower window seal connection 210b are coupled to similar passages on the other side of the base plate 115 and extend from the fourth side 317.

The upper chamber body seal connection 208a is coupled to the outer surface 220 of the base body 117 adjacent to the body seal passage 332. The body seal passage 332 extends between the third side 316 and the upper surface 211 of the base body 117, such that the body seal passage 332 fluidly connects the third side 316 and a portion of the upper surface 211 of the base body 117. The body seal passage 332 includes a first body seal passage portion 332a and a second body seal passage portion 332b.

The first body seal passage portion 332a extends from the third side toward the inner surface 218. The first body seal passage portion 332a is connected to the second body seal passage portion 332b at a distal end of the first body seal passage portion 332a furthest from the third side 316. The second body seal passage portion 332b extends from a portion of the upper surface 211 disposed between the first seal groove 304 and the second seal groove 305, such as between the first seal groove 304 and the upper cooling channel 310, towards the lower surface 214. The second body seal passage portion 332b is connected to the first body seal passage portion 332a at a distal end of the second body seal passage portion 332b furthest from the upper surface 211. The first body seal passage portion 332a and the second body seal passage portion 332b are connected at an angle, such as a perpendicular angle, such that the first body seal passage portion 332a extends in a direction perpendicular to the second body seal passage portion 332b. The first body seal passage portion 332a and the second body seal passage portion 332b are linear portions. The passage portions being linear enables easy formation of the passage portions and reduces manufacturing costs.

The opening of the first body seal passage portion 332a adjacent to the third side 316 is surrounded by a connection seal groove 334. The connection seal groove 334 is sized to receive an o-ring and is disposed as a groove formed in the third side 316 of the outer surface 220. A first seal cap 333 is disposed coupled to the opening of the first body seal passage portion 332a. The first seal cap 333 is fluidly coupled to a first vacuum pump 325a, such that the first vacuum pump 325a is in fluid communication with a portion of the upper surface 211 and assists in the formation of a seal between the first seal groove 304 and the second seal groove 305 when the inject ring 110 is disposed on top of the base plate 115.

The lower purge gas connection 209a is fluidly coupled to the lower purge gas passage 340. The lower purge gas passage 340 extends from the third side 316 of the outer surface 220 to the inner surface 218 of the base body 117. The lower purge gas passage 340 is a linear passage with an inlet formed on the third side 316 and an outlet formed on the inner surface 218. The lower purge gas passage 340 is disposed at an angle to the substrate transfer passage 116 and the one or more exhaust passages, such as an angle other than 0 degrees or 180 degrees with respect to the substrate transfer passage 116, such as an angle of between 5 degrees and 175 degrees with respect to the substrate transfer passage 116. The inlet of the lower purge gas passage 340 is surrounded by a lower purge seal groove 342. The lower purge seal groove 342 is formed in the third side 316 of the outer surface 220. The lower purge seal groove 342 is sized to receive an o-ring and assist in the formation of a seal between the inlet to the lower purge gas passage 340 and a lower purge connection cap 341. The lower purge connection cap 341 is connected to a purge gas line and fluidly couples the second purge gas source 331b to the lower purge gas passage 340 and therefore the annular opening 215 (or a purge plenum 365 if a liner, such as the liner 360, is utilized).

The lower window seal connection 210a is coupled to the lower window seal passage 327. The lower window seal passage 327 extends between the third side 316 and the lower surface 214 of the base body 117, such that the lower window seal passage 327 fluidly connects the third side 316 and a portion of the lower surface 214 of the base body 117. The lower window seal passage 327 includes a first lower window seal passage portion 327a and a second lower window seal passage portion 327b.

The first lower window seal passage portion 327a extends from the third side toward the inner surface 218. The first lower window seal passage portion 327a is connected to the second lower window seal passage portion 327b at a distal end of the first lower window seal passage portion 327a furthest from the third side 316. The second lower window seal passage portion 327b extends from a portion of the lower surface 214 disposed between the first lower seal groove 312 and the second lower seal groove 313. The second lower window seal passage portion 327b is connected to the first lower window seal passage portion 327a at a distal end of the second lower window seal passage portion 327b furthest from the lower surface 214. The first lower window seal passage portion 327a and the second lower window seal passage portion 327b are connected at an angle, such as a perpendicular angle, such that the first lower window seal passage portion 327a extends in a direction perpendicular to the second lower window seal passage portion 327b. The first lower window seal passage portion 327a and the second lower window seal passage portion 327b are linear.

The opening of the first lower window seal passage portion 327a adjacent to the third side 316 is surrounded by a connection seal groove 329. The connection seal groove 329 is sized to receive an o-ring and is disposed as a groove formed in the third side 316 of the outer surface 220. A second seal cap 328 is disposed coupled to the opening of the first lower window seal passage portion 327a. The second seal cap 328 is fluidly coupled to a second vacuum pump 325b, such that the second vacuum pump 325b is in fluid communication with a portion of the lower surface 214 and assists in the formation of a seal between the first lower seal groove 312 and the second lower seal groove 313 when the base plate 115 is in contact with the lower window 109. In some embodiments, each of the first lower seal groove 312 and the second lower seal groove 313 are sized to receive protrusions along the lower window 109 therein to assist in holding the lower window 109 and to better form a seal between the base plate 115 and the lower window 109.

The first lower seal groove 312 and the lower cooling channel 311 are formed in a prime groove formed in the lower surface 214. The prime groove is larger than the second lower seal groove 313 and disposed radially outward from the second lower seal groove 313. The prime groove has a T-shaped channel formation component 326 inserted therein to form the first lower seal groove 312 and the lower cooling channel 311. The channel formation component 326 may be a ring with a T-shaped cross section. The channel formation component 326 encloses the lower cooling channel 311 and forms the bottom portion and at least one sidewall of the first lower seal groove 312. In some embodiments, the channel formation component 326 may be another shape, such as an H-shape or an L-shape.

FIG. 3F is a schematic cross sectional view illustration of the base plate 115 and the exhaust seal connection 307 of FIG. 3B through the plane 3F-3F. The exhaust seal connection 307 is coupled to an exhaust seal passage 345. The exhaust seal passage 345 is disposed within the base body and extends from the upper surface 211 of the base body 117 to the second side 315 of the outer surface 220 of the base body 117. The exhaust seal passage 345 includes a first exhaust seal passage portion 345a and a second exhaust seal passage portion 345b. The first exhaust seal passage portion 345a includes an inlet within the upper surface 211 and extends from the upper surface 211 towards the lower surface 214. The second exhaust seal passage portion 345b includes an outlet within the second side 315 of the outer surface 220 and extends inwards towards the inner surface 218. The first exhaust seal passage portion 345a intersects the second exhaust seal passage portion 345b at a distal end of the first exhaust seal passage portion 345a furthest from the upper surface 211. The second exhaust seal passage portion 345b intersects the first exhaust seal passage portion 345a at a distal end of the second exhaust seal passage portion 345b furthest from the second side 315. The first exhaust seal passage portion 345a and the second exhaust seal passage portion 345b intersect at an angle, such that the first exhaust seal passage portion 345a extends at a perpendicular angle from the second exhaust seal passage portion 345b. The first exhaust seal passage portion 345a and the second exhaust seal passage portion 345b are each linear passages to assist in ease of formation and gas flow.

A connection seal groove 349 is disposed around the inlet to the first exhaust seal passage portion 345a. The connection seal groove 349 is disposed in the upper surface 211 and surrounds the inlet to the first exhaust seal passage portion 345a. The connection seal groove 349 is sized to receive an o-ring. The o-ring assists in forming a seal between the inlet to the exhaust seal passage 345 and the third seal cap 352. The third seal cap 352 is an end connector to a gas line which is fluidly coupled to the third vacuum pump 325c, such that the third seal cap 352 fluidly couples the third vacuum pump 325c to the exhaust seal passage 345.

The one or more exhaust coupling seal grooves 335 includes a first seal groove 347 and a second seal groove 348. The first seal groove 347 and the second seal groove 348 are disposed around and surround the one or more exhaust passages 118. The first seal groove 347 is disposed radially inward of the second seal groove 348 when viewed with respect to the one or more exhaust passages 118. The outlet of the second exhaust seal passage portion 345b is disposed between the first seal groove 347 and the second seal groove 348 to enable the third vacuum pump 325c to form a seal between a first o-ring and a second o-ring when the second side 315 is coupled to an exhaust module (not shown).

Figure 3G:
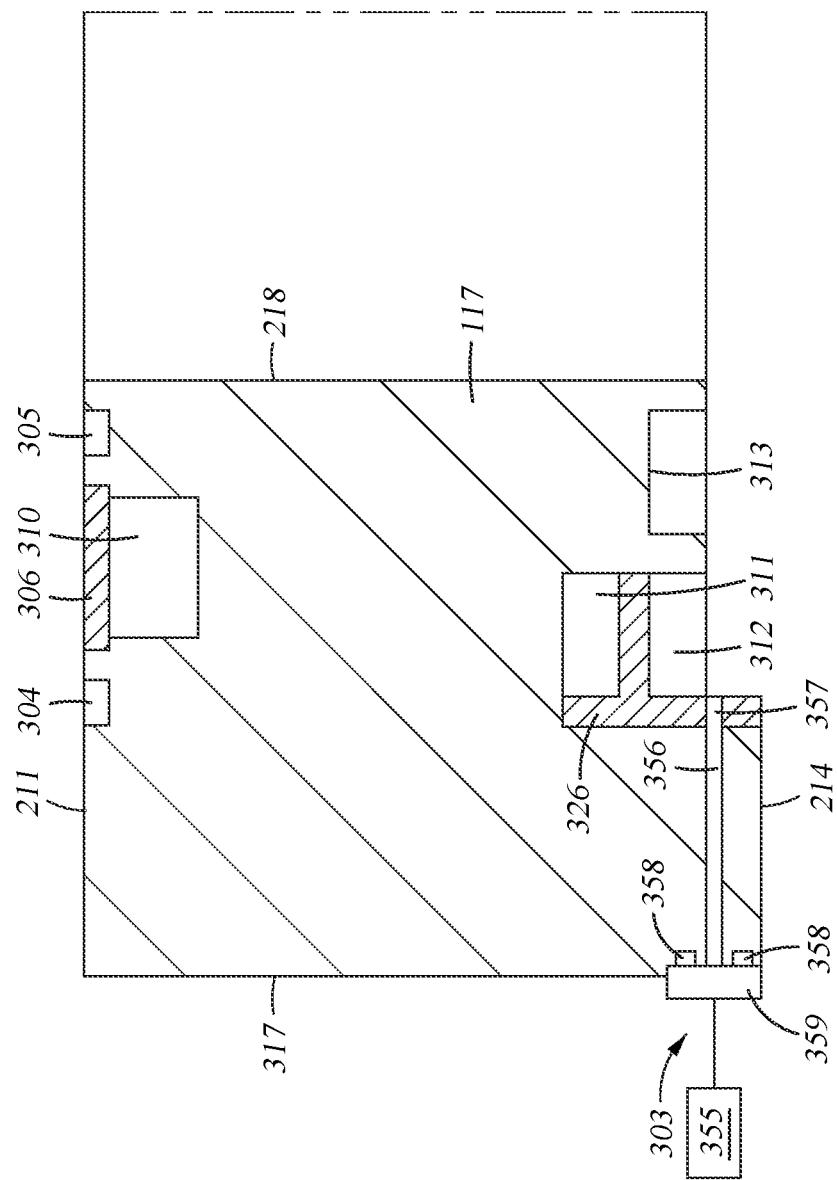
FIG. 3G is a schematic cross sectional view illustration of the base plate of FIG. 3B through the plane 3G-3G according to embodiments of the present disclosure.

A rim pressure connection 303 is shown in FIG. 3G. The rim pressure connection 303 is coupled to a rim pressure passage 356. The rim pressure passage 356 is disposed between the fourth side 317 of the outer surface 220 and a step 357 formed within the lower surface 214. The step 357 is formed between the first lower seal groove 312 and the fourth side 317 of the outer surface 220. The step 357 narrows the base body 117 as the base body 117 extends radially inward toward the central axis A.

The outlet to the rim pressure passage 356 is disposed within the step 357 and outside of the first lower seal groove 312 such that the rim pressure passage 356 can supply gas to a region below the first lower seal groove 312. The region may be the plenum below the lower window 109 and the plenum is pressurized by the supply of gas from the rim pressure passage 356. Gas is provided to the rim pressure passage 356 by a pressurization pump 355. The pressurization pump 355 is coupled to the rim pressure passage 356 by a rim pressure connector 359. The rim pressure connector 359 is coupled to the fourth side 317 of the outer surface 220. A connection seal groove 358 is disposed around the inlet of the rim pressure passage 356 and enables a seal to be made between the rim pressure passage 356 and the rim pressure connector 359.

Figure 3H:
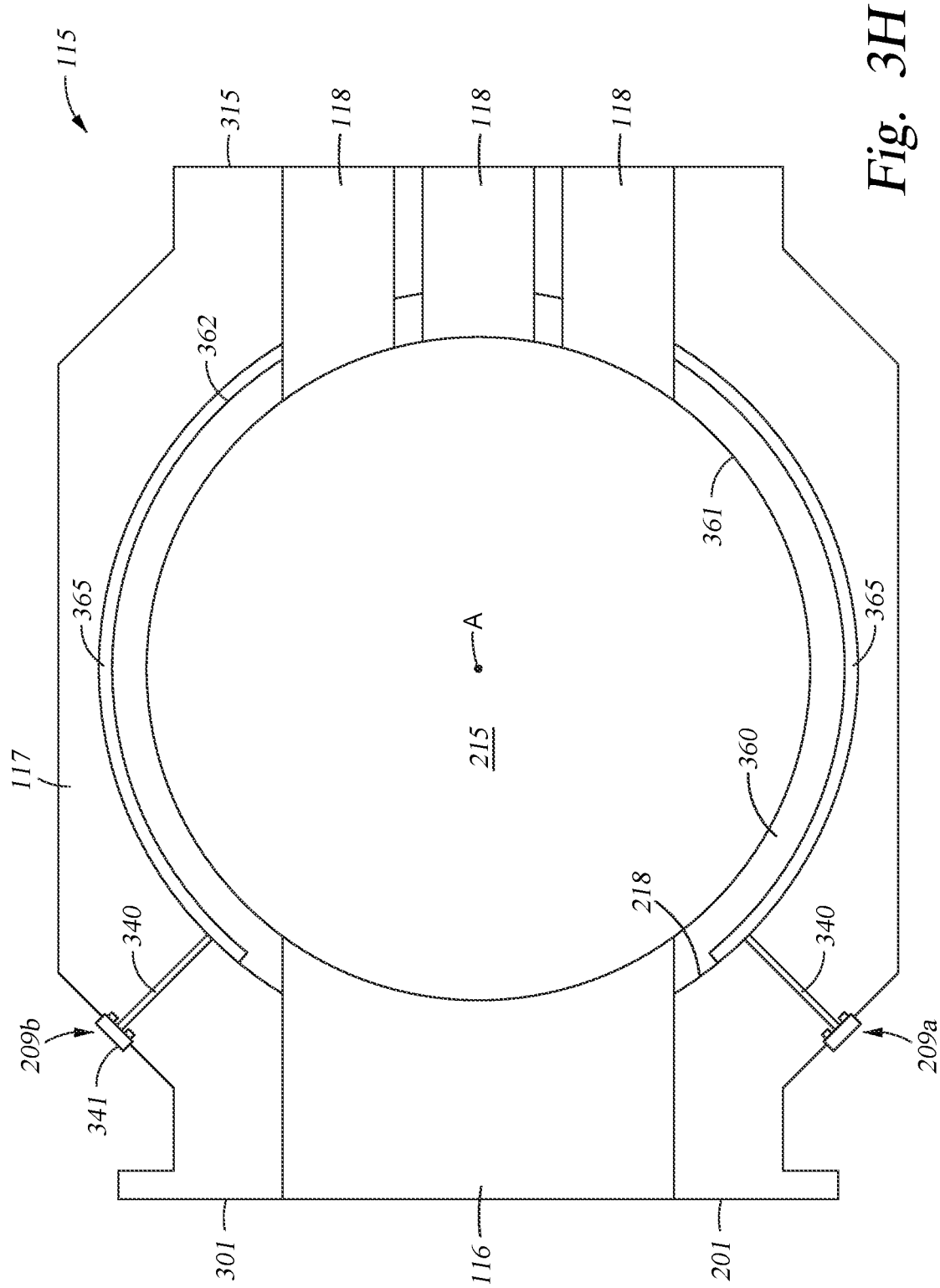
FIG. 3H is a cross sectional schematic view illustration of the base plate of FIG. 3A further including a liner.

FIG. 3H is a cross sectional schematic view illustration of the base plate 115 of FIG. 3A further including a liner 360. The liner 360 is disposed along the inner surface 218 of the base plate 115. The liner 360 includes a plurality of passages disposed therethrough to correspond to the substrate transfer passage 116 and the one or more exhaust passages 118. The liner 360 disclosed herein is a lower liner. There is a separate upper liner 430 disposed within the inject ring 110 (FIG. 4F). The liner 360 of the base plate 115 and the liner 430 of the inject ring 110 may be coupled together to form a single chamber body liner.

The liner 360 includes an inner liner surface 361 and an outer liner surface 362. The inner liner surface 361 forms a portion of the processing volume 136 within FIG. 1. The outer liner surface 362 is disposed facing the inner surface 218 of the base plate 115. The outer liner surface 362 and the inner surface 218 of the base plate 115 form a purge plenum 365 disposed therebetween. The purge plenum 365 is in fluid communication with the lower purge gas passages 340 formed on either side of the substrate transfer passage 116. The two lower purge gas passages 340 supply purge gas to the purge plenum 365 to remove contaminants and process gases from between the outer liner surface 362 and the inner surface 218 of the base plate 115. The purge plenum 365 is disposed around over half of the inner surface 218 of the base plate 115, such that the purge plenum 365 surrounds over about 180 degrees of the annular opening 215, such as over about 220 degrees, such as over about 250 degrees. The purge plenum 365 extends from the outlet of the lower purge gas passages 340 to the one or more exhaust passages 118. In some embodiments, the purge plenum 365 extends slightly inward from the lower purge gas passages 340 towards the substrate transfer passage 116, but does not intersect the substrate transfer passage 116. Each of the lower purge gas passages 340 are disposed closer to the substrate transfer passage 116 than the one or more exhaust passages 118. Purge gas from the lower purge gas passages 340 travels from a portion of the purge plenum 365 adjacent to the lower purge gas passages 340 towards the one or more exhaust passages 118 along the inner surface 218 of the base plate 115 and the outer liner surface 362 of the liner 360.

FIGS. 4A-4F are schematic views illustrating the inject ring 110 described with respect to FIGS. 1 and 2A-2B. The inject ring 110 is generally placed on top of the base plate 115 and coupled to the base plate 115. The inject ring 110 being separated from the base plate 115 enables the inject ring 110 to be serviced or replaced without replacing the base plate 115. This saves on cost and enables more cost effective variation of the distribution, size, and orientation of the gas inject passages 111 with different base plates 115 without the replacement of the entire chamber body assembly 105. The lower surface 212 of the inject ring 110 is sized to couple to the upper surface 211 of the base plate 115.

Figure 4A:
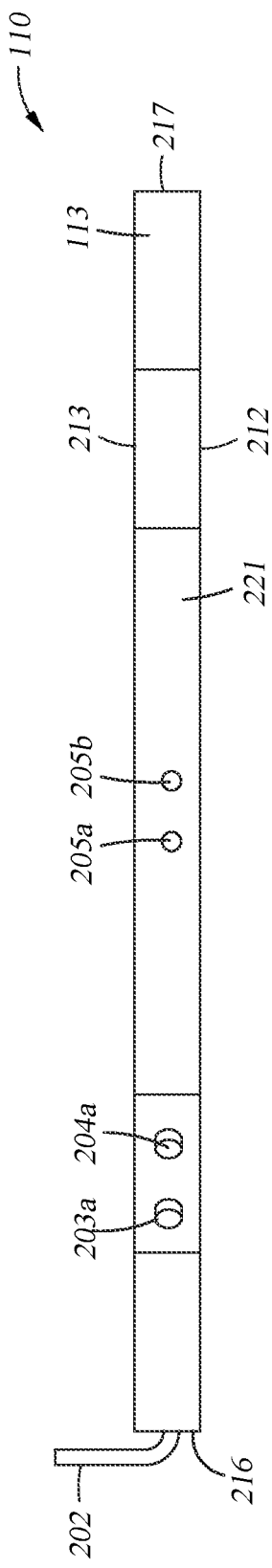
FIG. 4A is a schematic side view illustration of an inject ring according to embodiments of the present disclosure.
Figure 4C:
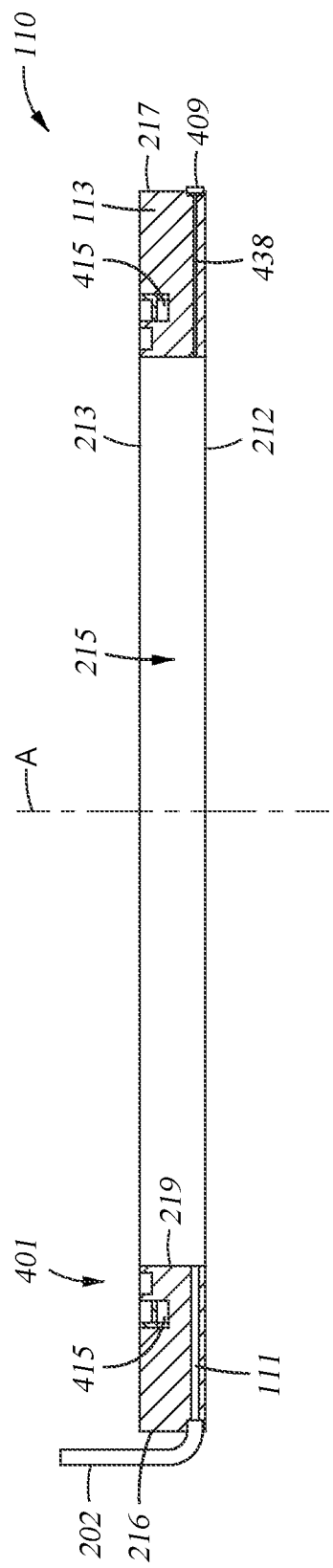
FIG. 4C is a schematic cross sectional side view illustration of the inject ring of FIG. 4B through plane 4C-4C according to embodiments of the present disclosure.

As illustrated in FIG. 4A, the inject ring 110 includes one or more cooling channel connections 205a, 205b, such as a cooling channel inlet 205a and a cooling channel outlet 205b. The cooling channel inlet 205a and the cooling channel outlet 205b are disposed on the outer surface 221 of the inject body 113. The upper window seal connections 203a, 203b and the upper purge gas connections 204a, 204b are also disposed on the outer surface 221 of the inject body 113. The upper window seal connections 203a, 203b and the upper purge gas connections 204a, 204b are disposed closer to the first side 216 and the one or more gas line connections 202 than the second side 217. The first upper window seal connection 203a and the first upper purge gas connection 204a are disposed on a third side 410 of the outer surface 221 of the inject body 113. The second upper window seal connection 203b and the second upper purge gas connection 204b are disposed on a fourth side 411 of the outer surface 221 of the inject body 113.

The third side 410 and the fourth side 411 are disposed on opposite sides of the inject body 113. The third side 410 and the fourth side 411 are sometimes described as outer sidewalls of the inject body 113. In some embodiments, any passages which pass through one of the outer sidewalls of the inject body 113 may alternatively pass through the other outer sidewall instead. The first upper window seal connection 203a and the first upper purge gas connection 204a are mirror images of the second upper window seal connection 203b and the second upper purge gas connection 204b. The gas passages in which the connections are coupled to also mirror on either side of the inject ring 110. Both the third side 410 and the fourth side 411 are disposed between the first side 216 and the second side 217. The one or more gas line connections 202 are disposed along a first side 216 of the outer surface 221 of the inject body 113.

Figure 4B:
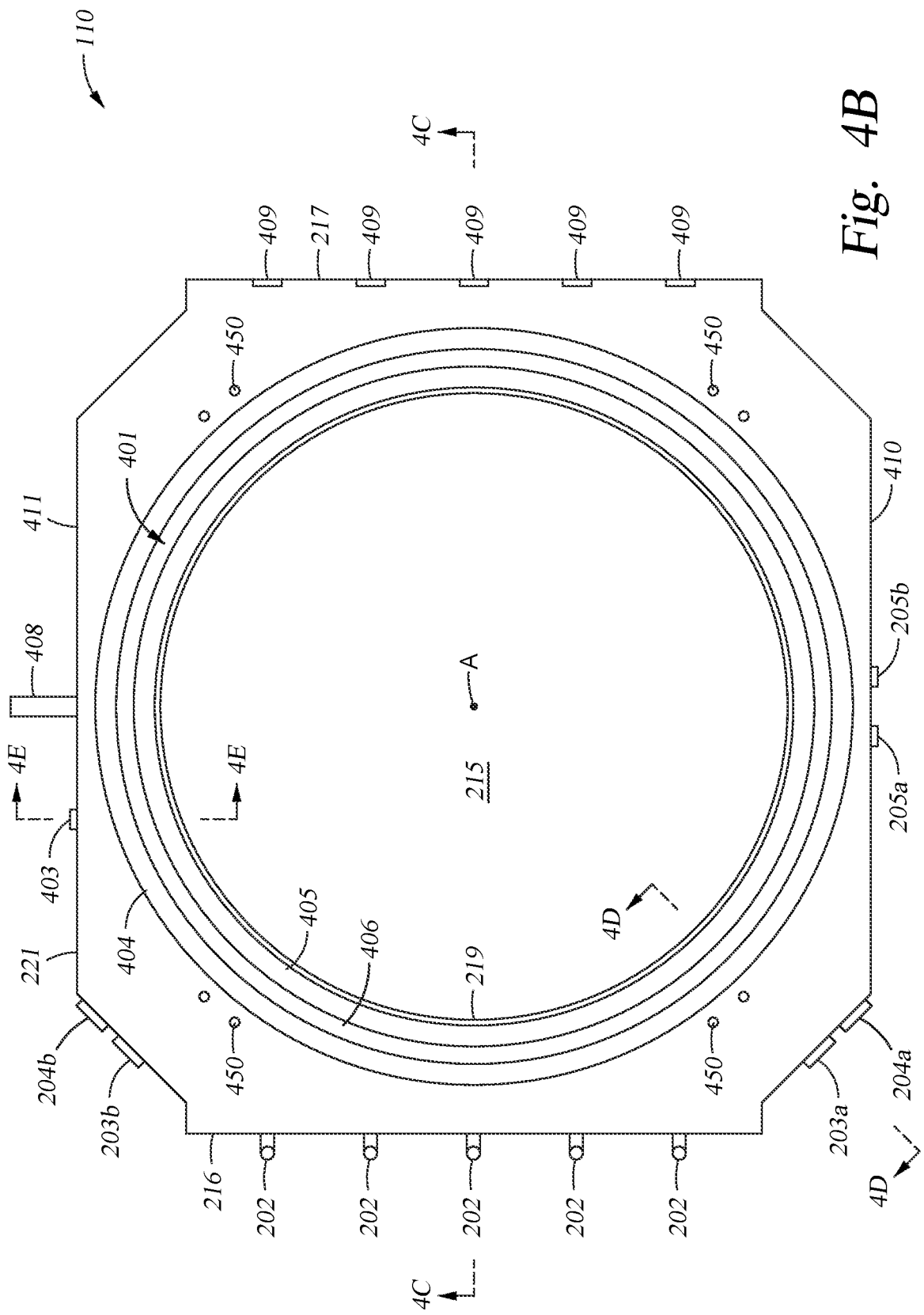
FIG. 4B is a schematic plan view illustration of the inject ring of FIG. 4A according to embodiments of the present disclosure.

As illustrated in FIG. 4B, the inject ring 110 further includes a plurality of fastener through holes 450, temperature calibrator ports 409, one or more upper coupling seal grooves 401, and a cross-flow connection 408. The fastener through holes 450 are disposed from the upper surface 213 of the inject ring 110 to the lower surface 212 of the inject ring 110. The fastener through holes 450 are sized to receive a fastener, such as a screw or a bolt. The fastener through holes 450 are positioned such that the fastener through holes 450 of the inject ring 110 and the fastener openings 323 of the base plate 115 align with one another. A single fastener is inserted into both the fastener through holes 450 and the fastener openings 323 to couple the inject ring 110 and the base plate 115 together. In some embodiments, there are four or more fastener through holes 450 disposed about the upper surface 213 of the inject ring 110, such as six or more fastener through holes 450, such as eight or more fastener through holes 450.

The plurality of fastener through holes 450 are disposed evenly around the inner surface 219 in order to distribute the coupling force between the base plate 115 and the inject ring 110 and enable proper sealing. In some embodiments, the fastener through holes 450 are grouped into sets with the sets being evenly distributed around the inner surface 219. The sets may be groups of two or more fastener through holes 450, such as two fastener through holes 450 or three fastener through holes 450. In embodiments described herein, two or more fastener through holes 450 are disposed between the inner surface 219 and a first side 216 of the outer surface 221 while an additional two or more fastener through holes 450 are disposed between the inner surface 219 and the second side 217 of the outer surface 220. The fastener through holes 450 are disposed radially outward of the one or more upper coupling seal grooves 401.

The one or more upper coupling seal grooves 401 include a first upper seal groove 404 and a second upper seal groove 405 and are formed in the upper surface 213 of the inject ring 110. The first upper seal groove 404 and the second upper seal groove 405 are disposed around the inner surface 219 of the inject ring 110 and surround the inner surface 219. The first upper seal groove 404 is disposed radially outward of the second upper seal groove 405 and concentric with the second upper seal groove 405. Both the first upper seal groove 404 and the second upper seal groove 405 are centered about the central axis A, which passes through the middle of the annular opening 215.

The temperature calibration ports 409 are disposed on the second side 217 of the outer surface 221 of the inject body 113. The temperature calibration ports 409 are sized to receive a thermocouple such that the temperature at different points of a susceptor, such as the substrate support 106, may be measured during a calibration operation. In some embodiments there are a plurality of temperature calibration ports 409, such as three or more temperature calibration ports 409, such as five or more temperature calibration ports 409, such as five temperature calibration ports 409.

The cross-flow connection 408 is disposed within the fourth side 411 of the outer surface 221 of the inject body 113. The cross-flow connection 408 is coupled to a cross-flow passage 434 (FIG. 4F) and is disposed at an angle to the plurality of gas inject passages 111. In embodiments herein, the cross-flow passage 434 is disposed such that gas is injected at an angle to the flow of gas from the plurality of gas inject passages 111. In some embodiments, the cross-flow passage 434 is disposed at a perpendicular angle to the plurality of gas inject passages 111 and the flow of gas from the plurality of gas inject passages 111. In yet other embodiments, the cross-flow passage 434 is disposed at an angle other than 0 degrees or 180 degrees from the plurality of gas inject passages 111, such as an angle of about 10 degrees to about 180 degrees with respect to the plurality of gas inject passages 111 and the flow of gas from the plurality of gas inject passages 111. In some embodiments, there may be more than one cross-flow connection 408 and more than one cross-flow passage 434, such that there are one or more cross-flow connections 408 and subsequent cross-flow passages 434 through the inject body 113. The cross-flow connection 408 is disposed such that gas flown from the cross-flow connection 408 would enter the annular opening 215 in a plane intersecting the central axis A.

A inject ring cooling channel 415, one of the gas inject passages 111, and the one or more upper coupling seal grooves 401 are further illustrated in FIG. 4C, which is a cross sectional view through the plane 4C-4C of FIG. 4B. The inject ring cooling channel 415 is disposed below the one or more upper coupling seal grooves 401. Specifically, the inject ring cooling channel 415 is disposed at least partially below the first upper seal groove 404. The inject ring cooling channel 415 is disposed within the inject body 113 and between the inner surface 219 and the outer surface 221. The inject ring cooling channel 415 surrounds the inner surface 219 and the annular opening 215. The inject ring cooling channel 415 is fluidly coupled to the one or more cooling channel connections 205a, 205b, such that the cooling channel inlet 205a supplied a cooling fluid, such as water, to the inject ring cooling channel 415 while the cooling channel outlet 205b removed cooling fluid from the inject body 113.

The plurality of gas inject passages 111 are formed through the inject body 113 between the outer surface 221 and the inner surface 219. The plurality of gas inject passages 111 are formed below the one or more upper coupling seal grooves 401 and the inject ring cooling channel 415. The plurality of gas inject passages 111 are in fluid communication with the one or more gas line connections 202. The plurality of gas inject passages 111 fluidly connect the one or more gas line connections 202 to the annular opening 215.

The temperature calibration ports 409 are shown coupled to a calibration passage 438. The calibration passage 438 extends from the second side 217 of the outer surface 221 to the inner surface 219. The outlets of the temperature calibration ports 409 on the inner surface 219 is disposed opposite the outlets of the gas inject passages 111.

Figure 4D:
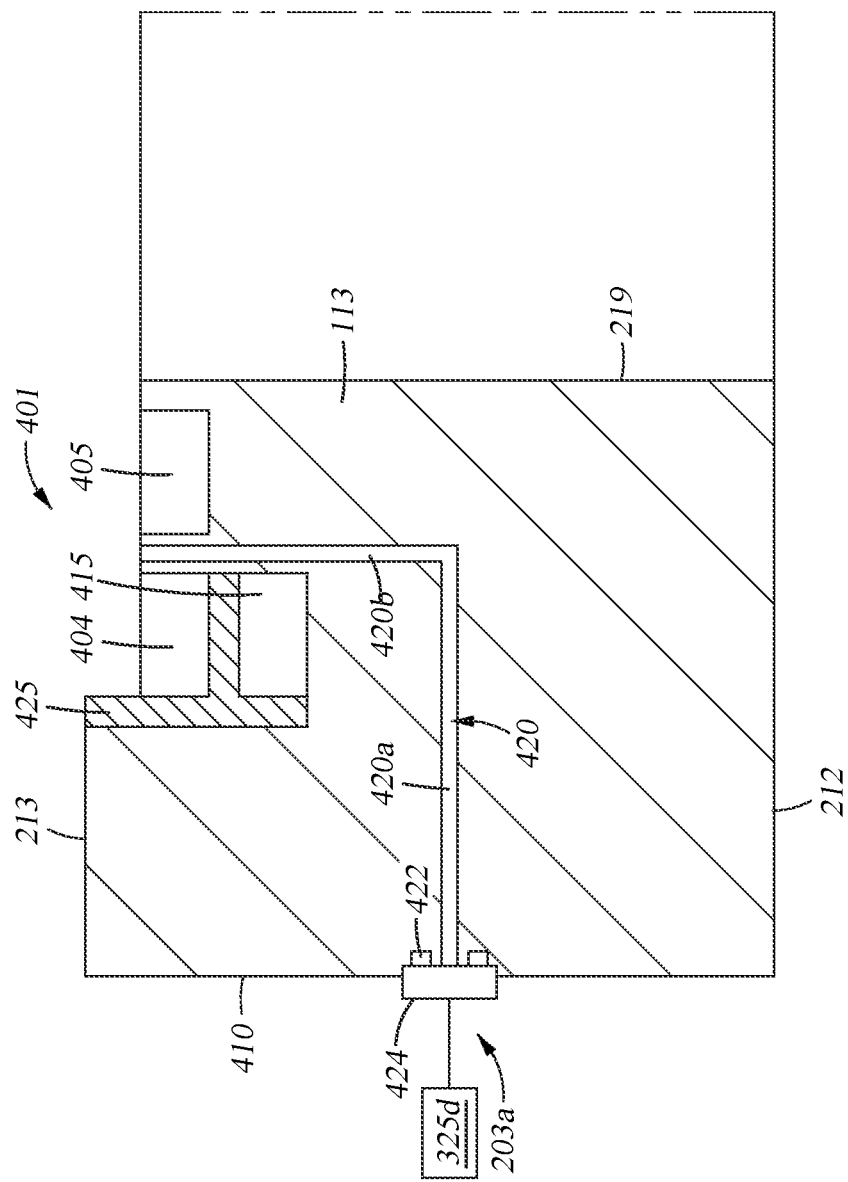
FIG. 4D is a schematic cross sectional view illustration of the inject ring of FIG. 4B through the plane 4D-4D according to embodiments of the present disclosure.

FIG. 4D is a schematic cross sectional view illustration of the inject ring 110 of FIG. 4A through the plane 4D-4D of FIG. 4B. The one or more upper coupling seal grooves 401 and the upper window seal connection 203a are shown in greater detail herein. The upper window seal connection 203a is coupled to the upper window seal passage 420. The upper window seal passage 420 extends between the third side 410 and the upper surface 213 of the inject body 113, such that the upper window seal passage 420 fluidly connects the third side 410 and a portion of the upper surface 213 of the inject body 113. The upper window seal passage 420 includes a first upper window seal passage portion 420a and a second upper window seal passage portion 420b.

The first upper window seal passage portion 420a extends from the third side 410 toward the inner surface 219. The first upper window seal passage portion 420a is connected to the second upper window seal passage portion 420b at a distal end of the first upper window seal passage portion 420a furthest from the third side 410. The second upper window seal passage portion 420b extends from a portion 406 of the upper surface 213 disposed between the first upper seal groove 404 and the second upper seal groove 405. The second upper window seal passage portion 420b is connected to the first upper window seal passage portion 420a at a distal end of the second upper window seal passage portion 420b furthest from the upper surface 213. The first upper window seal passage portion 420a and the second upper window seal passage portion 420b are connected at an angle, such as a perpendicular angle, such that the first upper window seal passage portion 420a extends in a direction perpendicular to the second upper window seal passage portion 420b.

The opening of the first upper window seal passage portion 420a through the third side 410 is surrounded by a connection seal groove 422. The connection seal groove 422 is sized to receive an o-ring and is disposed as a groove formed in the third side 410 of the outer surface 221 of the inject ring 110. An inject purge seal cap 424 is disposed on and coupled to the opening of the first upper window seal passage portion 420a. The inject purge seal cap 424 is fluidly coupled to a fourth vacuum pump 325d, such that the fourth vacuum pump 325d is in fluid communication with a portion of the upper surface 213 and assists in the formation of a seal between the first upper seal groove 404 and the second upper seal groove 405 when the inject ring 110 is in contact with the upper window 108.

The first upper seal groove 404 and the inject ring cooling channel 415 are formed in a prime groove formed in the upper surface 213 of the inject body 113. The prime groove is larger than the first upper seal groove 404, such that the groove encompasses both the first upper seal groove 404 and the inject ring cooling channel 415. The prime groove has a T-shaped channel formation component 425 inserted therein. The channel formation component 425 may be a ring with a T-shaped cross section. The channel formation component 425 encloses the inject ring cooling channel 415 and forms the bottom portion and a sidewall of the first upper seal groove 404. In some embodiments, the channel formation component 425 may be another shape, such as an H-shape or an L-shape.

Figure 4E:
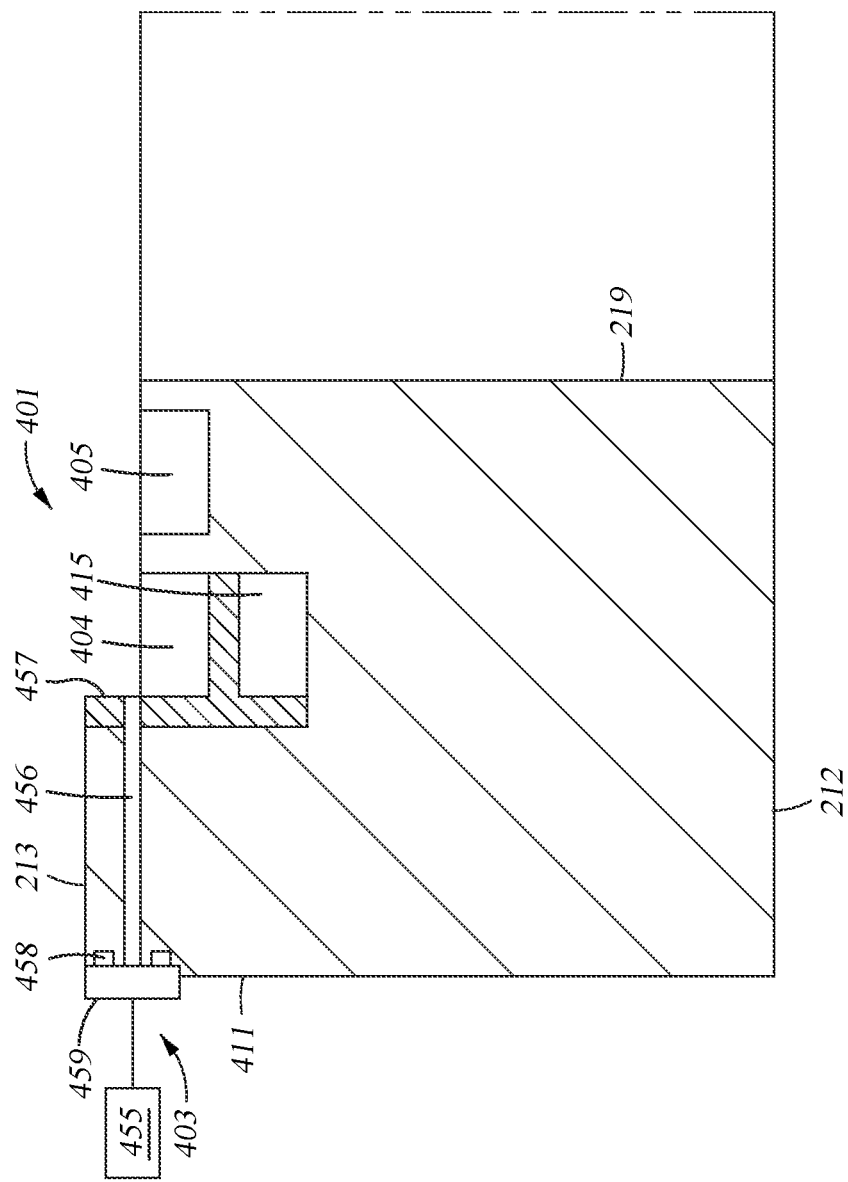
FIG. 4E is a schematic cross sectional view illustration of the inject ring 110 of FIG. 4B through the plane 4E-4E according to embodiments of the present disclosure.
Figure 4F:
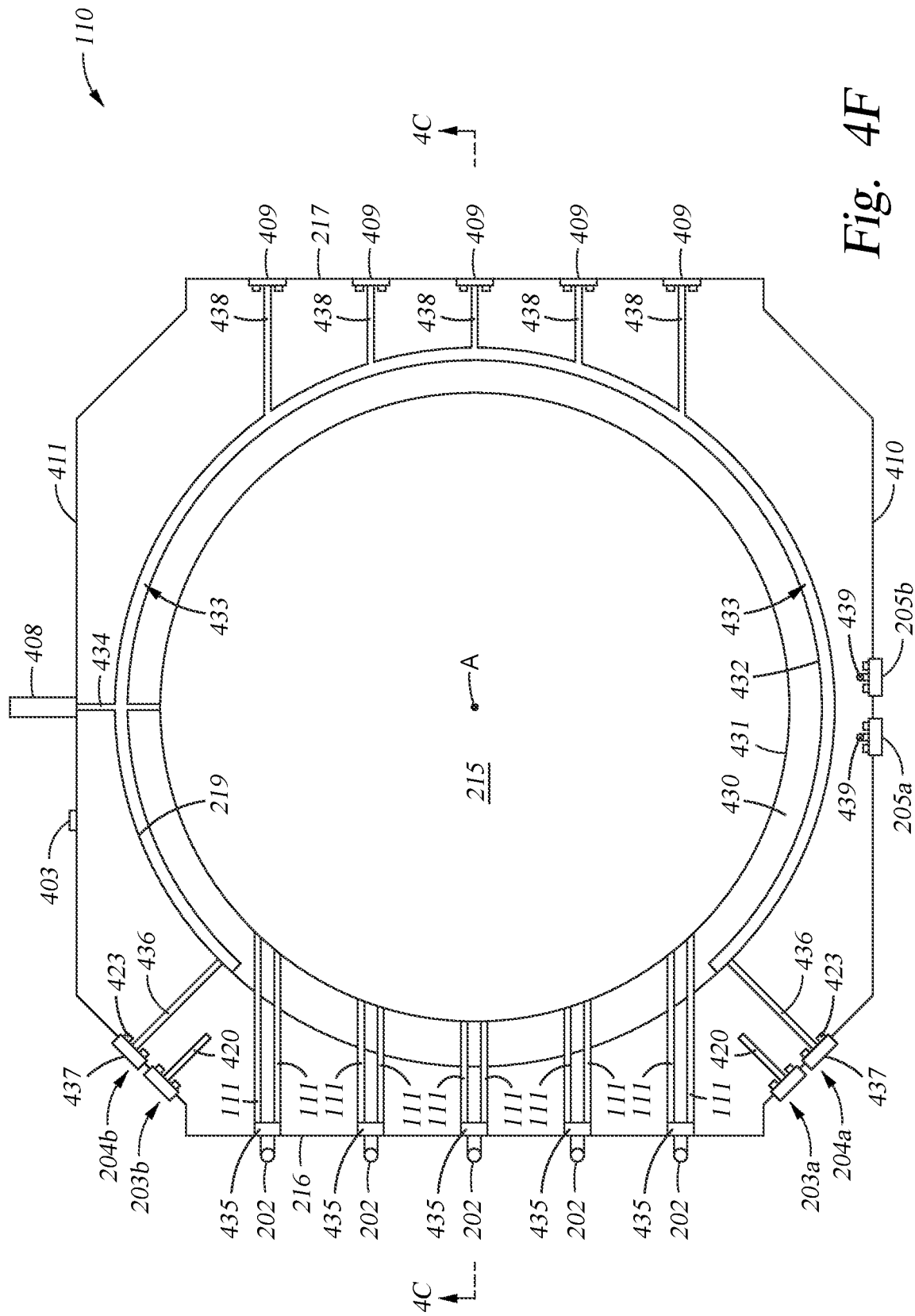
FIG. 4F is a cross sectional schematic view illustration of the inject ring of FIG. 4A further including a liner.

FIG. 4E illustrates a rim pressure connection 403. The rim pressure connection 403 is coupled to a rim pressure passage 456. The rim pressure passage 456 is disposed between the fourth side 411 of the outer surface 221 of the inject ring 110 and a step 457 formed within the upper surface 213. The step 457 is formed between the first upper seal groove 404 and the fourth side 411 of the outer surface 221. The step 457 narrows the inject body 113 as the inject body 113 extends radially inward toward the central axis A.

The outlet to the rim pressure passage 456 is disposed within the step 457 and outside of the first upper seal groove 404 such that the rim pressure passage 456 can supply gas to a region above the first upper seal groove 404. The region may be the plenum above the upper window 108 and the plenum is pressurized by the supply of gas from the rim pressure passage 456. Gas is provided to the rim pressure passage 456 by a pressurization pump 455. In some embodiments the pressurization pump 455 is the same as the pressurization pump 355 coupled to the rim pressure passage 356 of the base plate 115. The pressurization pump 455 is coupled to the rim pressure passage 456 by a rim pressure connector 459. The rim pressure connector 459 is coupled to the fourth side 411 of the outer surface 221. A connection seal groove 458 is disposed around the inlet of the rim pressure passage 456 and enables a seal to be made between the rim pressure passage 456 and the rim pressure connector 459.

FIG. 4F is a cross sectional schematic view illustration of the inject ring 110 of FIG. 4A further including a liner 430. The liner 430 is disposed along the inner surface 219 of the inject ring 110. The liner 430 includes a plurality of passages disposed therethrough to match the plurality of gas inject passages 111 and the cross-flow passage 434. The liner 430 may also include openings therethrough adjacent to the calibration passages 438. The liner 430 disclosed herein is an upper liner as described with relation to the lower liner 360 in FIG. 3H.

The liner 430 includes an inner liner surface 431 and an outer liner surface 432. The inner liner surface 431 forms a portion of the processing volume 136 within FIG. 1. The outer liner surface 432 is disposed facing the inner surface 219 of the inject ring 110. The outer liner surface 432 and the inner surface 219 of the inject ring 110 form a purge plenum 433 disposed therebetween. The purge plenum 433 between the inner surface 219 of the inject ring 110 and the outer liner surface 432 may be in fluid communication with the purge plenum 365 between the outer liner surface 362 of the lower liner 360 and the inner surface 218 of the base plate 115. The purge plenum 433 of the upper liner 430 is in fluid communication with one or more upper purge gas passages 436 formed on either side of the plurality of gas inject passages 111.

The upper purge gas passages 436 are disposed from both the third side 410 of the outer surface 221 of the inject body 113 and the fourth side 411 of the outer surface 221 of the inject body 113. The upper purge gas passages 436 extend from the third side 410 and the fourth side 411 respectively to the inner surface 219 of the inject body 113. The upper purge gas passages 436 are disposed at an angle to the gas inject passages 111, such as an angle other than 0 degrees or 180 degrees with respect to the gas inject passages 111, such as an angle of between 5 degrees and 175 degrees with respect to the gas inject passages 111. The upper purge gas connections 204a, 204b include upper purge connection caps 437 disposed adjacent a connection seal groove 423. The connection seal groove 423 is sized to receive an o-ring and is disposed as a groove formed in the third side 410 and the fourth side 411 of the outer surface 221 of the inject ring 110. An o-ring is disposed within the connection seal groove 423 and forms a seal between the upper purge connection caps 437 and the upper purge gas passages 436. The upper purge connection cap 437 is connected to a purge gas line and fluidly couples a purge gas source, similar to the second purge gas source 331b of FIG. 3E, to the upper purge gas passage 436 and therefore the annular opening 215/the purge plenum 433.

The two upper purge gas passages 436 supply purge gas to the purge plenum 433 to remove contaminants and process gases from between the outer liner surface 432 and the inner surface 219 of the inject ring 110. The purge plenum 433 is disposed around over half of the inner surface 219 of the inject ring 110, such that the purge plenum 465 surrounds over about 180 degrees of the annular opening 215, such as over about 220 degrees, such as over about 250 degrees. The purge plenum 433 extends from the outlet of the upper purge gas passages 436 around the inner circumference of the inner surface 219 and towards the second side 217 of the outer surface 221, where the purge gas is vented through the one or more exhaust passages 118 (FIG. 3H). In some embodiments, the purge plenum 433 extends slightly inward from the upper purge gas passages 436 towards the plurality of gas inject passages 111, but does not intersect any of the gas inject passages 111. Purge gas from the upper purge gas passages 436 travels from a portion of the purge plenum 433 adjacent to the upper purge gas passages 436 towards the one or more exhaust passages 118 along the inner surface 219 of the inject ring 110 and the outer liner surface 432 of the liner 430.

The plurality of gas inject passages 111 are coupled to a gas inject feed 435. A single gas inject feed 435 may supply one or more gas inject passages 111. In the embodiment of FIG. 4F, a single gas inject feed 435 supplied two gas inject passages 111, such that the ratio of gas line connections 202 to gas inject passages 111 is 2:1. The ratio of gas line connections 202 to gas inject passages 111 is generally about 1:1 to about 4:1, such as about 1:1 to about 3:1. Each of the gas inject feeds 435 is coupled to a gas line connection 202. Each of the gas line connections 202 is coupled to one or more process gas sources 112. In some embodiments the process gas source 112 is a gas panel with multiple gas sources disposed therein. The spacing between each of the plurality of gas inject passages 111 is adjustable and is shown herein schematically.

The cooling channel inlet 205a and the cooling channel outlet 205b are fluidly coupled to the inject ring cooling channel 415 by fluid paths 439. The fluid paths 439 may be vertical paths through the inject ring 110 to fluidly connect the cooling channel inlet 205a and the cooling channel outlet 205b to the inject ring cooling channel 415. Each of the cooling channel inlet 205a and the cooling channel outlet 205b may be coupled to coolant lines (not shown).

While the foregoing is directed to embodiments of the present disclosure, other and further embodiments of the disclosure may be devised without departing from the basic scope thereof, and the scope thereof is determined by the claims that follow.

What is claimed is:

1. A chamber body assembly for substrate processing comprising:
   a base plate comprising:
      a first upper surface;
      a first lower surface;
      a first inner surface forming an annular opening;
      a first outer surface disposed radially outward from the first inner surface;
      a substrate transfer passage formed between the first inner surface and the first outer surface along a first side; and
      one or more exhaust passages formed between the first inner surface and the first outer surface opposite the substrate transfer passage along a second side, the one or more exhaust passages vertically aligned with the substrate transfer passage;
      one or more intermediate coupling seal grooves disposed along the first upper surface and surrounding the first inner surface, wherein the one or more intermediate coupling seal grooves comprises:
         a first intermediate coupling seal groove; and
         a second intermediate coupling seal groove;
      an upper cooling channel disposed along the first upper surface and surrounding the first inner surface, the upper cooling channel disposed between the first intermediate coupling seal groove and the second intermediate coupling seal groove; and
   an inject ring comprising:
      a second upper surface;
      a second lower surface contacting the first upper surface;
      a second inner surface disposed from the second upper surface to the second lower surface and forming the annular opening;
      a second outer surface disposed from the second upper surface to the second lower surface and disposed radially outward from the second inner surface; and
      a plurality of gas inject passages formed through the second inner surface along the first side, and the plurality of gas inject passages are disposed vertically above the substrate transfer passage, and vertically offset from the one or more exhaust passages.

2. The chamber body assembly of claim 1, further comprising
   a channel cover placed within the upper cooling channel, the channel cover positioned to isolate the upper cooling channel from the first upper surface.

3. The chamber body assembly of claim 1, further comprising one or more lower coupling seal grooves disposed along the first lower surface and surrounding the first inner surface and one or more upper coupling seal grooves disposed along the second upper surface and surrounding the first inner surface, wherein the one or more lower coupling seal grooves and the one or more upper coupling seal grooves each further comprise:
   a first seal groove; and
   a second seal groove.

4. The chamber body assembly of claim 1, further comprising:
   a first plurality of fastener openings disposed around the first inner surface and through the first upper surface; and
   a second plurality of fastener openings disposed around the second inner surface, from the second upper surface to the second lower surface, and aligned with the first plurality of fastener openings.

5. The chamber body assembly of claim 1, wherein the base plate further comprises:
   one or more upper chamber body seal passages connecting the first outer surface and the one or more intermediate coupling seal grooves.

6. The chamber body assembly of claim 1, wherein the plurality of gas inject passages further comprise:
   a plurality of inject passage outlets vertically offset from the one or more exhaust passages.

7. The chamber body assembly of claim 1, further comprising:
a flange disposed along the first outer surface on the first side, wherein the substrate transfer passage is disposed through the flange, and
wherein the first inner surface and the second inner surface have a same inner radius.

8. The chamber body assembly of claim 1, wherein the base plate further comprises one or more window seal passages connecting the first outer surface and the first lower surface.

9. The chamber body assembly of claim 1, wherein the base plate further comprises one or more exhaust coupling sealing grooves disposed around the one or more exhaust passages on the first outer surface.

10. The chamber body assembly of claim 1, wherein the inject ring further comprises:
one or more cross-flow ports disposed between the second outer surface and the second inner surface and at an angle to the plurality of gas inject passages.

11. A chamber body assembly for substrate processing comprising:
a base plate comprising:
a first upper surface;
a first lower surface;
a first inner surface disposed from the first upper surface to the first lower surface and forming an annular opening;
a first outer surface disposed from the first upper surface to the first lower surface and radially outward from the first inner surface;
a substrate transfer passage formed between the first inner surface and the first outer surface along a first side;
one or more exhaust passages formed between the first inner surface and the first outer surface opposite the substrate transfer passage along a second side, the one or more exhaust passages vertically aligned with the substrate transfer passage and at least partially overlapping with the substrate transfer passage along a horizontal plane;
one or more intermediate coupling sealing grooves disposed along the first upper surface and surrounding the first inner surface, wherein the one or more intermediate coupling seal grooves comprises:
a first intermediate coupling seal groove; and
a second intermediate coupling seal groove;
an upper cooling channel disposed along the first upper surface and surrounding the first inner surface, the upper cooling channel disposed between the first intermediate coupling seal groove and the second intermediate coupling seal groove;
one or more lower coupling sealing grooves disposed along the first lower surface and surrounding the first inner surface; and
one or more first purge gas passages disposed between the first inner surface and the first outer surface; and
an inject ring comprising:
a second upper surface;
a second lower surface contacting the first upper surface;
a second inner surface disposed from the second upper surface to the second lower surface and forming the annular opening;
a second outer surface disposed from the second upper surface to the second lower surface and disposed radially outward from the second inner surface;
a plurality of gas inject passages formed through the second inner surface along the first side, the plurality of gas inject passages are disposed vertically above the substrate transfer passage, and vertically offset from the one or more exhaust passages;
one or more upper coupling seal grooves disposed along the second upper surface and surrounding the second inner surface; and
one or more second purge gas passages disposed between the second inner surface and the second outer surface.

12. The chamber body assembly of claim 11, wherein the first inner surface and the second inner surface are aligned and centered about a central axis such that an inner radius of the first inner surface and an inner radius of the second inner surface are the same.

13. The chamber body assembly of claim 11, wherein the base plate further comprises:
a flange disposed along the first outer surface on the first side of the base plate, wherein the substrate transfer passage is disposed through the flange and the flange includes a chamber coupling surface; and
one or more cooling channels disposed through the base plate.

14. The chamber body assembly of claim 11,
a channel cover placed within the upper cooling channel, the channel cover positioned to isolate the upper cooling channel from the first upper surface.

15. The chamber body assembly of claim 11, wherein the base plate further comprises:
one or more upper chamber body seal passages connecting the first outer surface and the first upper surface; and
one or more window seal passages connecting the first outer surface and the first lower surface.

16. The chamber body assembly of claim 11, wherein the base plate further comprises:
one or more exhaust coupling seal grooves disposed around the one or more exhaust passages on the first outer surface.

17. The chamber body assembly of claim 11, wherein the base plate further comprises:
a chamber coupling purge passage connecting the first outer surface and a chamber coupling surface; and
an exhaust seal passage connecting the first upper surface and the first outer surface.

18. The chamber body assembly of claim 11, wherein first lower surface is a stepped surface and comprises:
a step;
the one or more lower coupling seal grooves disposed therein; and
a rim pressure passage having an outlet disposed in the step and connecting the first outer surface and the first lower surface.

19. The chamber body assembly of claim 11, further comprising:
a plurality of gas line connections disposed along the second outer surface and coupled to the plurality of gas inject passages.

20. The chamber body assembly of claim 11, wherein the upper coupling seal grooves further comprise:
a first seal groove; and
a second seal groove.

* * * * *